(12) United States Patent
Lee et al.

(10) Patent No.: US 9,806,004 B2
(45) Date of Patent: Oct. 31, 2017

(54) SEMICONDUCTOR DEVICES HAVING A TSV, A FRONT-SIDE BUMPING PAD, AND A BACK-SIDE BUMPING PAD

(71) Applicant: Samsung Electronics Co., Ltd., Suwon-si, Gyeonggi-do (KR)

(72) Inventors: Ho-Jin Lee, Seoul (KR); Byunglyul Park, Seoul (KR); Jisoon Park, Suwon-si (KR); Jinho An, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/953,857

(22) Filed: Nov. 30, 2015

(65) Prior Publication Data
US 2016/0155686 A1 Jun. 2, 2016

(30) Foreign Application Priority Data
Dec. 1, 2014 (KR) .................. 10-2014-0169872

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76898* (2013.01); *H01L 23/5226* (2013.01); *H01L 24/03* (2013.01); *H01L 24/05* (2013.01); *H01L 24/06* (2013.01); *H01L 24/92* (2013.01); *H01L 2224/039* (2013.01); *H01L 2224/0345* (2013.01); *H01L 2224/0347* (2013.01); *H01L 2224/03452* (2013.01); *H01L 2224/03462* (2013.01); *H01L 2224/03614* (2013.01); *H01L 2224/03845* (2013.01); *H01L 2224/0401* (2013.01); *H01L 2224/05016* (2013.01); *H01L 2224/05018* (2013.01); *H01L 2224/05019* (2013.01); *H01L 2224/05025* (2013.01); *H01L 2224/05026* (2013.01);
(Continued)

(58) Field of Classification Search
None
See application file for complete search history.

(56) References Cited

U.S. PATENT DOCUMENTS 6,731,007 B1 5/2004 Saito et al.
7,939,941 B2 5/2011 Chiou et al.
(Continued)

FOREIGN PATENT DOCUMENTS

KR 1020120058114 6/2012

*Primary Examiner* — Cory Eskridge
(74) *Attorney, Agent, or Firm* — Myers Bigel, P.A.

(57) ABSTRACT

Semiconductor devices are provided. The semiconductor devices include a substrate, a first interlayer insulating layer disposed on a front-side of the substrate, a TSV structure passing through the first interlayer insulating layer and the substrate. The TSV structure has a bottom end protruding from a back-side of the substrate, a back-side insulating layer and a back-side passivation layer disposed on the back-side of the substrate, and a bumping pad buried in the back-side insulating layer and the back-side passivation layer and disposed on the bottom end of the TSV structure. The bottom end of the TSV structure protrudes into the back-side bumping pad, and top surfaces of the back-side passivation layer and the back-side bumping pad are coplanar.

19 Claims, 27 Drawing Sheets

(51) Int. Cl.
*H01L 23/522* (2006.01)
*H01L 21/768* (2006.01)

(52) U.S. Cl.
CPC .............. *H01L 2224/05027* (2013.01); *H01L 2224/0557* (2013.01); *H01L 2224/05073* (2013.01); *H01L 2224/05082* (2013.01); *H01L 2224/05083* (2013.01); *H01L 2224/05147* (2013.01); *H01L 2224/05155* (2013.01); *H01L 2224/05166* (2013.01); *H01L 2224/05184* (2013.01); *H01L 2224/05187* (2013.01); *H01L 2224/05556* (2013.01); *H01L 2224/05559* (2013.01); *H01L 2224/05564* (2013.01); *H01L 2224/05571* (2013.01); *H01L 2224/05572* (2013.01); *H01L 2224/05644* (2013.01); *H01L 2224/0601* (2013.01); *H01L 2224/06051* (2013.01); *H01L 2224/06181* (2013.01); *H01L 2224/16146* (2013.01); *H01L 2224/92* (2013.01); *H01L 2924/13091* (2013.01)

(56) References Cited

U.S. PATENT DOCUMENTS

| | | |
|---|---|---|
| 8,513,119 B2 | 8/2013 | Chang et al. |
| 8,546,188 B2 | 10/2013 | Liu et al. |
| 8,592,991 B2 | 11/2013 | Lee et al. |
| 8,836,085 B2 | 9/2014 | Yang et al. |
| 2011/0068466 A1* | 3/2011 | Chen ................ H01L 21/76898 257/737 |
| 2013/0200525 A1* | 8/2013 | Lee ...................... H01L 23/481 257/774 |
| 2014/0057430 A1 | 2/2014 | Lee et al. |

\* cited by examiner

SEMICONDUCTOR DEVICES HAVING A TSV, A FRONT-SIDE BUMPING PAD, AND A BACK-SIDE BUMPING PAD

CROSS-REFERENCE TO RELATED APPLICATION

This application claims priority under 35 U.S.C. §119 to Korean Patent Application No. 10-2014-0169872 filed on Dec. 1, 2014, the disclosure of which is hereby incorporated by reference in its entirety.

BACKGROUND

Field

Embodiments of the inventive concepts relate to semiconductor devices having a through silicon via (TSV), a front-side bumping pad, and a back-side bumping pad, and methods of fabricating the semiconductor devices.

Description of Related Art

Although a semiconductor device has reached limit in the degree of integration, since a greater capacity of the semiconductor device is still required, a technique of stacking a plurality of semiconductor devices has been proposed. A method of fabricating the conventional bumping pads includes removing a pad barrier layer and a pad seed layer using a wet etching process. Thus, the improvement of the degree of integration of the semiconductor device is very difficult because undercuts or the like are generated. Embodiments of the inventive concepts provide methods of forming the bumping pads by damascene processes.

SUMMARY

Embodiments of the inventive concepts provide semiconductor devices having a TSV, a front-side bumping pad, and a back-side bumping pad.

Other embodiments of the inventive concepts provide methods of fabricating semiconductor devices having a TSV, a front-side bumping pad, and a back-side bumping pad.

The technical objectives and embodiments of the inventive concepts are not limited to the above disclosure; other objectives and embodiments may become apparent to those of ordinary skill in the art based on the following descriptions.

In accordance with an aspect of the inventive concepts, a semiconductor device includes a substrate, a first interlayer insulating layer disposed on a front-side of a substrate, a TSV structure passing through the first interlayer insulating layer and the substrate, wherein the TSV structure has a bottom end protruding from a back-side of the substrate, a back-side insulating layer and a back-side passivation layer disposed on the back-side of the substrate, and a bumping pad buried in the back-side insulating layer and the back-side passivation layer and disposed on the bottom end of the TSV structure. The bottom end of the TSV structure protrudes into the back-side bumping pad. Top surfaces of the back-side passivation layer and the back-side bumping pad are coplanar.

In accordance with another aspect of the inventive concepts, a semiconductor device includes a substrate, a MOS transistor disposed on a front-side of a substrate, a first interlayer insulating layer covering the MOS transistor, a TSV structure passing through the first interlayer insulating layer and the substrate, a TSV connection circuit disposed on the first interlayer insulating layer to be electrically connected with a top end of the TSV structure, a front-side bumping pad disposed on the front-side of the substrate to be electrically connected with the TSV connection circuit, and a back-side bumping pad disposed on a back-side of the substrate to be connected with the TSV structure. The bottom end of the TSV structure protrudes into the back-side bumping pad.

In accordance with still another aspect of the inventive concepts, a semiconductor device includes a first interlayer insulating layer disposed on a front-side of a substrate, a TSV structure passing through the first interlayer insulating layer and the substrate, a TSV connection circuit disposed on the first interlayer insulating layer to be electrically connected with a top end of the TSV structure, a second interlayer insulating layer disposed on the first interlayer insulating layer to cover the TSV connection circuit, a front-side bumping pad disposed on the second interlayer insulating layer to be electrically connected with the TSV connection circuit, a back-side bumping pad disposed on a back-side of the substrate to be connected with a bottom end of the TSV structure, and a back-side blocking layer disposed on the back-side of the substrate to be in contact with side surfaces of the back-side bumping pad. The bottom end of the TSV structure protrudes into the back-side bumping pad. The back-side blocking layer comprises silicon carbonitride.

Details of other embodiments are included in detailed explanations and the drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings. The drawings are not necessarily to scale, emphasis instead being placed upon illustrating the principles of the inventive concepts. In the drawings.

DETAILED DESCRIPTION OF THE EMBODIMENTS

Figure 1A:
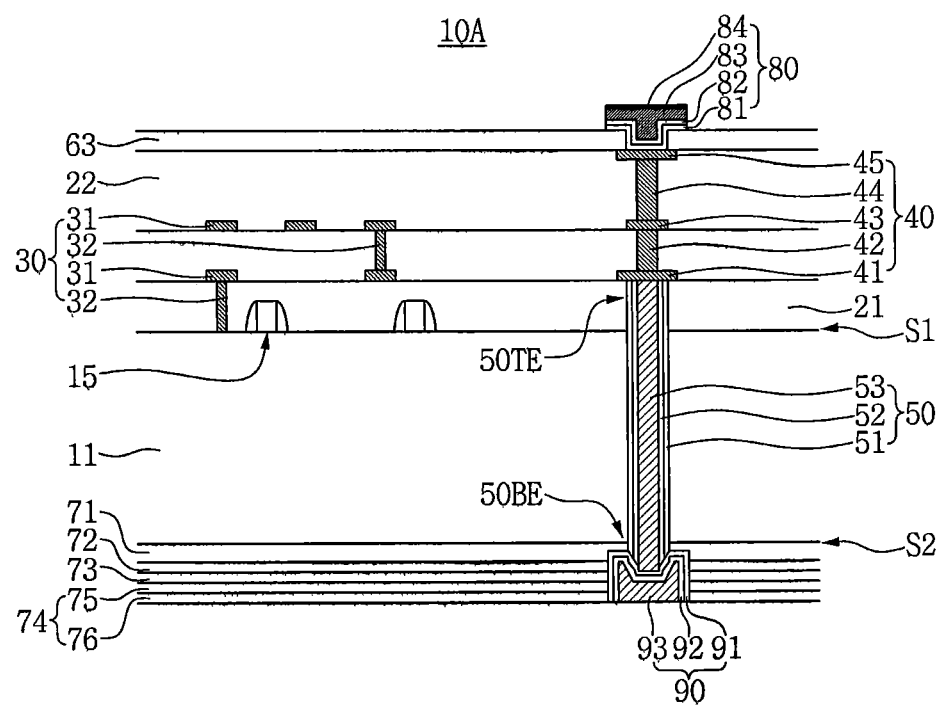
FIGS. 1A through 1H are cross-sectional views schematically illustrating semiconductor devices in accordance with embodiments of the inventive concepts.

Various embodiments will now be described more fully with reference to the accompanying drawings. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein to describe embodiments of the inventive concepts is not intended to limit the scope of the inventive concepts. The articles "a," "an," and "the" are singular in that they have a single referent; however, the use of the singular form in the present document should not preclude the presence of more than one referent. In other words, elements of the inventive concepts referred to in the singular form may number one or more, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein the term "and/or" includes any and all combinations of one or more of the associated listed items.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Like numerals refer to like elements throughout the specification. Accordingly, the same numerals and similar numerals can be described with reference to other drawings, even if not specifically described in a corresponding drawing. Further, when a numeral is not marked in a drawing, the numeral can be described with reference to other drawings.

FIGS. 1A through 1H are cross-sectional views schematically illustrating semiconductor devices in accordance with embodiments of the inventive concepts.

Referring to FIG. 1A, a semiconductor device 10A in accordance with an embodiment of the inventive concepts may include a MOS transistor 15, an inner circuit 30, a through silicon via (TSV) connection circuit 40, a first interlayer insulating layer 21, a second interlayer insulating layer 22 on a front-side S1 of a substrate 11, a TSV structure 50 vertically passing through the substrate 11 and the first interlayer insulating layer 21, a front-side bumping pad 80 above the front-side S1 of the substrate 11 to be vertically aligned with the TSV structure 50, and a back-side bumping pad 90 above/under a back-side S2 of the substrate 11 to be vertically aligned with the TSV structure 50.

The substrate 11 may include at least one of a single crystalline silicon wafer, a SiGe wafer, and a silicon on insulator (SOI) wafer. The MOS transistor 15 may be disposed directly on the front-side S1 of the substrate 11. The MOS transistor 15 may include an NMOS or a PMOS and may form a logic circuit or a switching device.

The first interlayer insulating layer 21 may cover the MOS transistor 15 and surround sidewalls of the TSV structure 50. The first interlayer insulating layer 21 may include at least one of silicon oxide ($SiO_2$), silicon oxycarbide (SiOC), silicon nitride (SiN), silicon carbonitride (SiCN), and another insulating material.

The TSV structure 50 may vertically and completely pass through the first interlayer insulating layer 21 and the substrate 11. The TSV structure 50 may include a TSV liner 51, a TSV barrier layer 52, and a TSV plug 53. The TSV liner 51 may surround the TSV barrier layer 52. The TSV barrier layer 52 may surround the TSV plug 53. The TSV liner 51 may include silicon oxide ($SiO_2$), the TSV barrier layer 52 may include TiN or TaN, and the TSV plug 53 may include Cu. A top surface of the TSV structure 50 and a top surface of the first interlayer insulating layer 21 may be coplanar.

The inner circuit 30 may include inner wires 31 extending in a horizontal direction, and inner vias 32 extending in a vertical direction. The inner circuit 30 may be electrically connected with the substrate 11 and/or the MOS transistor 15. The inner wires 31 and the inner vias 32 may include a metal.

The TSV connection circuit 40 may electrically connect the TSV structure 50 to the front-side bumping pad 80. The TSV connection circuit 40 may include a TSV connection pad 41, a lower TSV connection via 42, a TSV connection wire 43, an upper connection via 44, and a TSV input/output (TO) pad 45. The TSV connection pad 41 may formed on the first interlayer insulating layer 21 to be in contact with a top end 50TE of the TSV structure 50. The TSV connection wire 43 may be disposed at the same level as one of the inner wires 31. The TSV 10 pad 45 may be disposed at the highest level of the inner circuit 30 or the TSV connection circuit 40. The lower TSV connection via 42 may electrically connect the upper TSV connection pad 41 to the TSV connection wire 43, and the upper TSV connection via 44 may electrically connect the TSV connection wire 43 to the TSV IO pad 45. The TSV 10 pad 45 may be buried in the second interlayer insulating layer 22 and may be coplanar with the second interlayer insulating layer 22.

The inner circuit 30 and the TSV connection circuit 40 may include conductive materials. For example, the inner circuit 30 and the TSV connection circuit 40 may include metals such as tungsten (W), copper (Cu), nickel (Ni), or titanium (Ti), metal compounds such as titanium nitride (TiN) or tungsten nitride (WN), or metal silicides such as titanium silicide (TiSi), tungsten silicide (WSi), cobalt silicide (CoSi), or nickel silicide (NiSi). In some embodiments, the TSV IO pad 45 may include aluminum (Al) to be directly in contact with a probe of a test apparatus.

The second interlayer insulating layer 22 may cover the inner circuit 30 and may cover the TSV connection circuit 40 or surround sidewalls of the TSV connection circuit 40.

The semiconductor device 10A may further include a front-side passivation layer 63 on the second interlayer insulating layer 22 which exposes the top surface of the TSV JO pad 45. The front-side passivation layer 63 may include silicon nitride (SiN) or a polyimide.

The front-side bumping pad 80 may be formed on an exposed surface of the TSV IO pad 45 and the front-side passivation layer 63. The front-side bumping pad 80 may include a front-side pad barrier layer 81, a front-side pad seed layer 82, a front-side pad electrode 83, a front-side pad coating layer 84. The front-side bumping pad 80 will be described with reference to FIG. 2A in more detail.

The semiconductor device 10A may include a back-side insulating layer 71, a back-side stopper layer 72, a back-side blocking layer 73, and a back-side passivation layer 74 on a back-side S2 of the substrate 11. The back-side passivation layer 75 may include a lower back-side passivation layer 75 and an upper back-side passivation layer 76.

The back-side bumping pad 90 may be disposed on a bottom end 50BE of the TSV structure 50 that protrudes from the back-side S2 of the substrate 11. The back-side bumping pad 90 may include a back-side pad barrier layer 91, a back-side pad seed layer 92, and a back-side pad electrode 93.

The back-side insulating layer 71, the back-side stopper layer 72, the back-side blocking layer 73, the back-side passivation layer 74, and the back-side bumping pad 90 will be specifically described below.

Figure 1B:
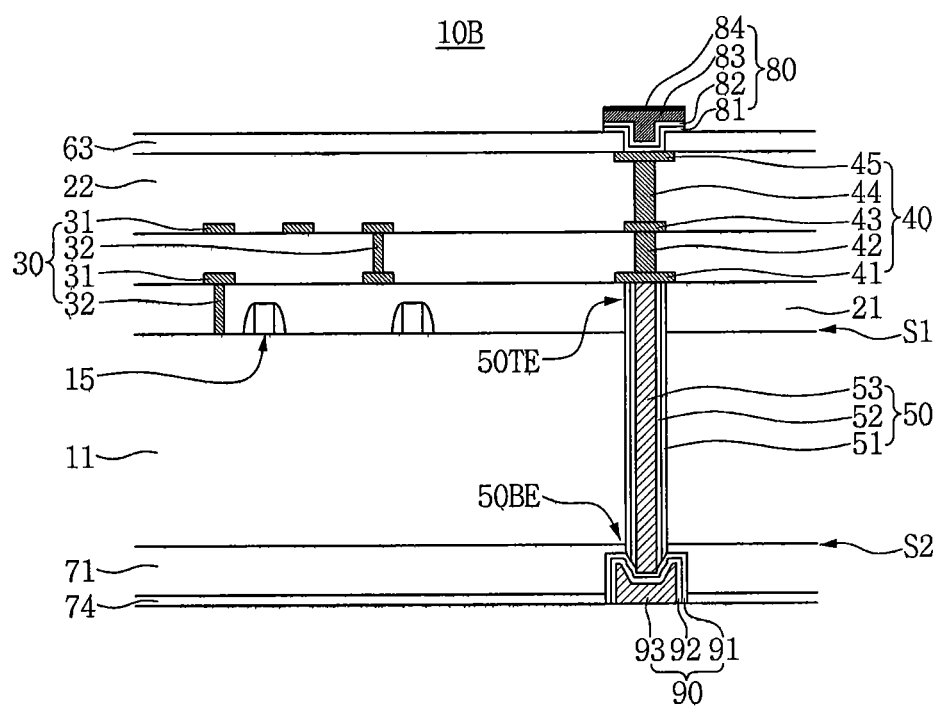

Referring to FIG. 1B, a semiconductor device 10B in accordance with an embodiment of the inventive concepts may include a MOS transistor 15, a first interlayer insulating layer 21, an inner circuit 30, a TSV connection circuit 40, a second interlayer insulating layer 22, a front-side passivation layer 63, a front-side bumping pad 80 on a front-side S1 of a substrate 11, a TSV structure 50 vertically passing through the substrate 11 and the first interlayer insulating layer 21, a back-side insulating layer 71, a back-side passivation layer 74, and a back-side bumping pad 90 on a back-side S2 of the substrate 11. The back-side bumping pad 90 may include a back-side pad barrier layer 91, a back-side pad seed layer 92, and a back-side pad electrode 93. The back-side insulating layer 71, the back-side passivation layer 74, and the back-side bumping pad 90 will be described with reference to FIG. 2C in more detail.

Figure 1C:
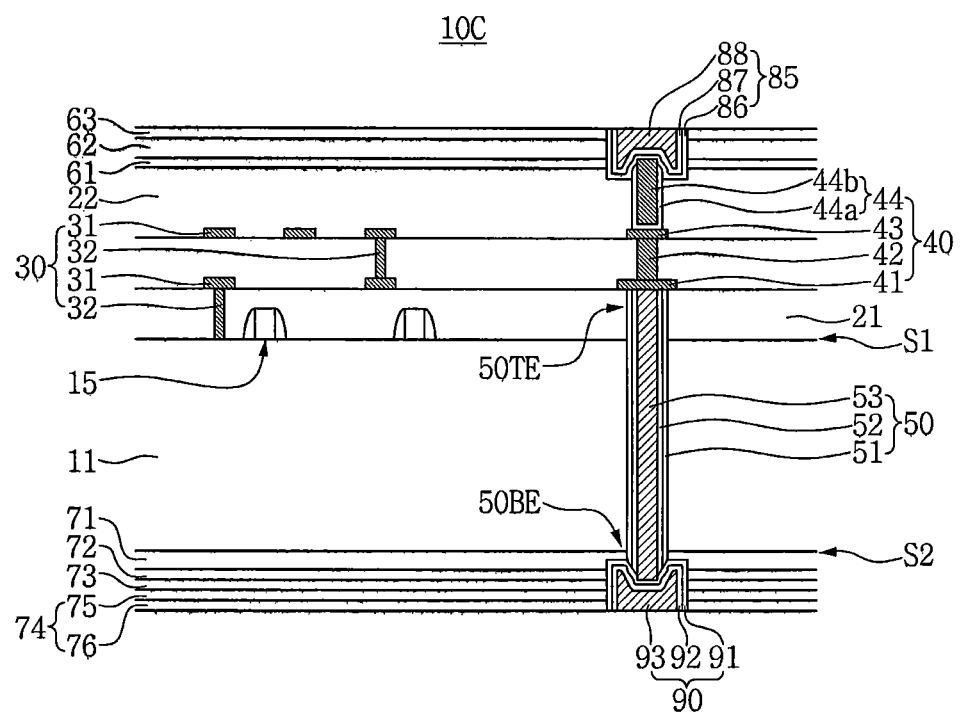

Referring to FIG. 1C, a semiconductor device 10C in accordance with an embodiment of the inventive concepts may include a MOS transistor 15, a first interlayer insulating layer 21, an inner circuit 30, a TSV connection circuit 40, a second interlayer insulating layer 22, a front-side capping layer 61, a front-side insulating layer 62, a front-side passivation layer 63, a front-side bumping pad 85 on a front-side S1 of a substrate 11, a TSV structure 50 vertically passing through the substrate 11 and the first interlayer insulating layer 21, a back-side insulating layer 71, a back-side stopper layer 72, a back-side blocking layer 73, a back-side passivation layer 74, and a back-side bumping pad 90 on a back-side S2 of the substrate 11.

An upper TSV connection via 44 of the TSV connection circuit 40 may include a connection via barrier layer 44a and a connection via plug 44b.

The front-side bumping pad 85 may include a front-side pad barrier layer 86, a front-side pad seed layer 87, and a front-side pad electrode 88.

The upper TSV connection via 44, the front-side capping layer 61, the front-side insulating layer 62, the front-side passivation layer 63, and the front-side bumping pad 85 will be described with reference to FIG. 2B in more detail.

Figure 1D:
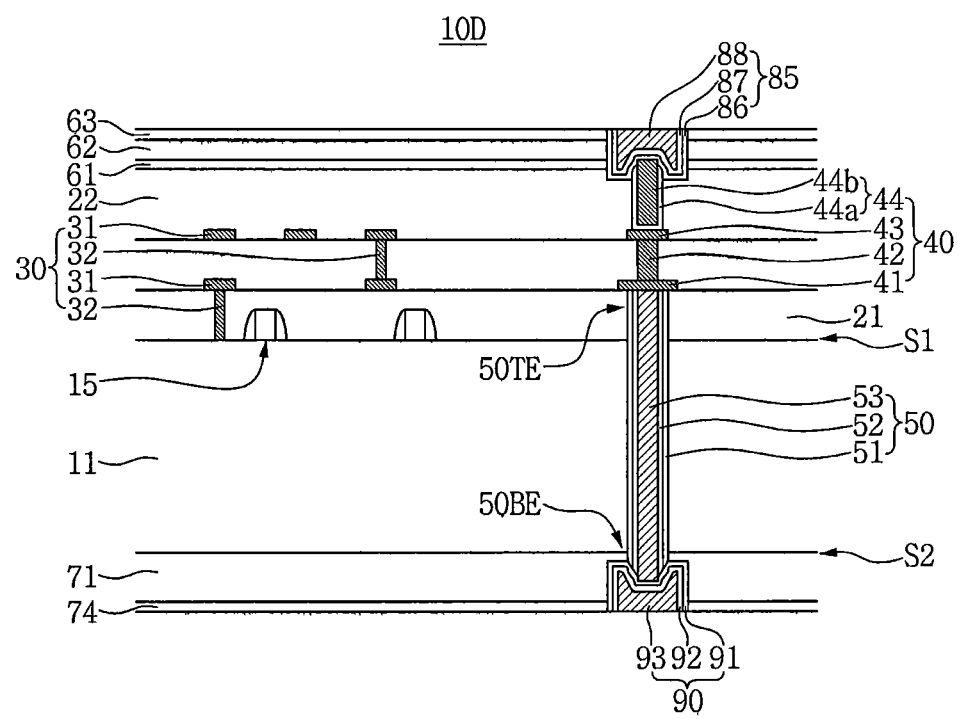

Referring to FIG. 1D, a semiconductor device 10D in accordance with an embodiment of the inventive concepts may include a MOS transistor 15, a first interlayer insulating layer 21, an inner circuit 30, a TSV connection circuit 40, a second interlayer insulating layer 22, a front-side capping layer 61, a front-side insulating layer 62, a front-side passivation layer 63, a front-side bumping pad 85 on a front-side S1 of a substrate 11, a TSV structure 50 vertically passing through the substrate 11 and the first insulating layer, and a back-side insulating layer 71, a back-side passivation layer 74, and a back-side bumping pad 90 on a back-side S2 of the substrate 11. The back-side insulating layer 71, the back-side passivation layer 74, and the back-side bumping pad 90 will be described with reference to FIG. 2D in more detail.

Figure 1E:
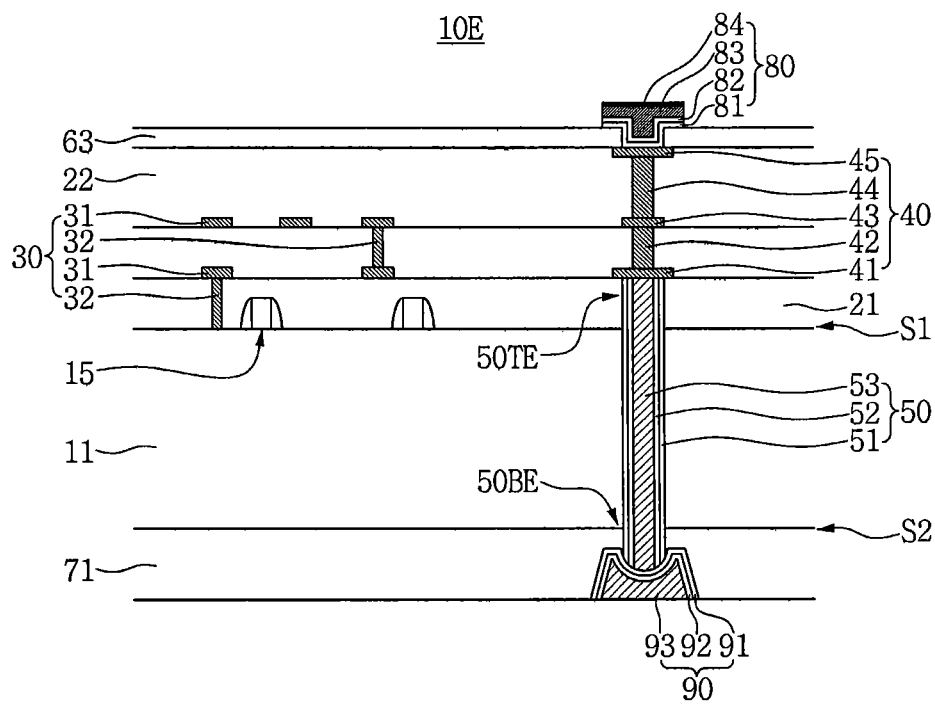

Referring to FIG. 1E, a semiconductor device 10E in accordance with an embodiment of the inventive concepts may include a MOS transistor 15, a first interlayer insulating layer 21, an inner circuit 30, a TSV connection circuit 40, a second interlayer insulating layer 22, a front-side passivation layer 63, a front-side bumping pad 80 on a front-side S1 of a substrate 11, a TSV structure 50 vertically passing through the substrate 11 and the first interlayer insulating layer 21, a back-side insulating layer 71, and a back-side bumping pad 90 on a back-side S2 of the substrate 11. The back-side bumping pad 90 may include sloped sidewalls. The back-side bumping pad 90 will be described with reference to FIG. 2E in more detail.

Figure 1F:
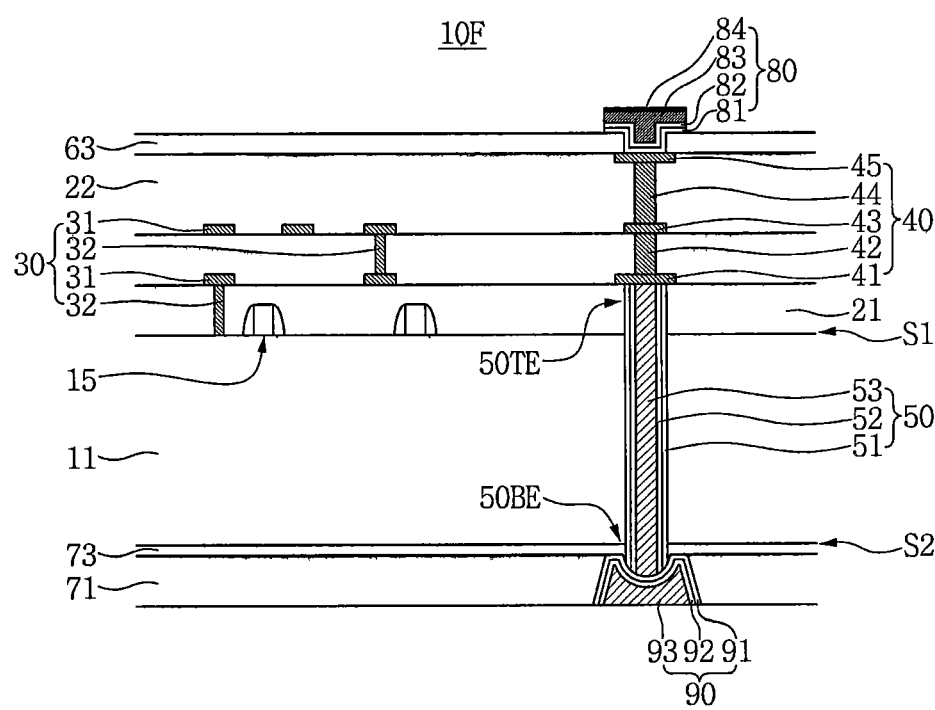

Referring to FIG. 1F, a semiconductor device 10F in accordance with an embodiment of the inventive concepts may include a MOS transistor 15, a first interlayer insulating layer 21, an inner circuit 30, a TSV connection circuit 40, a second interlayer insulating layer 22, a front-side passivation layer 63, a front-side bumping pad 80 on front-side S1 of a substrate 11, a TSV structure 50 vertically passing through the substrate 11 and the first interlayer insulating layer 21, a back-side blocking layer 73, a back-side insulating layer 71, and a back-side bumping pad 90 on a back-side S2 of the substrate 11. The back-side bumping pad 90 will be described with reference to FIG. 2F in more detail.

Figure 1G:
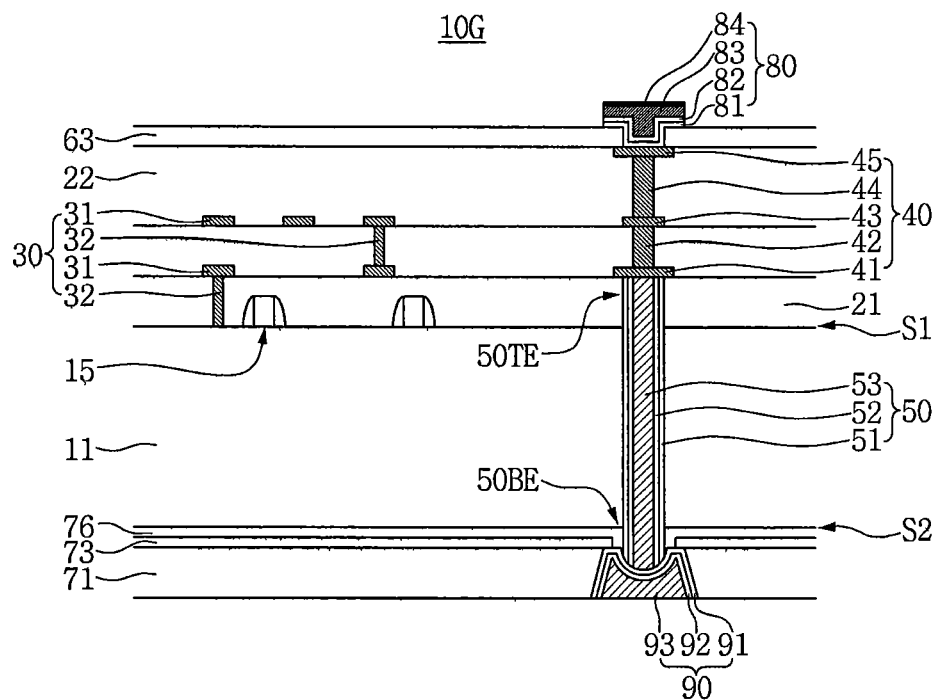

Referring to FIG. 1G, a semiconductor device 10G in accordance with an embodiment of the inventive concepts may include a MOS transistor 15, a first interlayer insulating layer 21, an inner circuit 30, a TSV connection circuit 40, a second interlayer insulating layer 22, a front-side passivation layer 63, a front-side bumping pad 80 on a front-side S1 of a substrate 11, a TSV structure 50 vertically passing through the substrate 11 and the first interlayer insulating layer 21, a back-side buffer layer 76, a back-side blocking layer 73 on the back-side buffer layer 76, a back-side insulating layer 71 on the back-side blocking layer 73, and a back-side bumping pad 90 buried in the back-side insulating layer 71 and being in contact with an upper surface of the back-side blocking layer 73 on a back-side S2 of the substrate 11. The back-side bumping pad 90 will be described with reference to FIG. 2G in more detail.

Figure 1H:
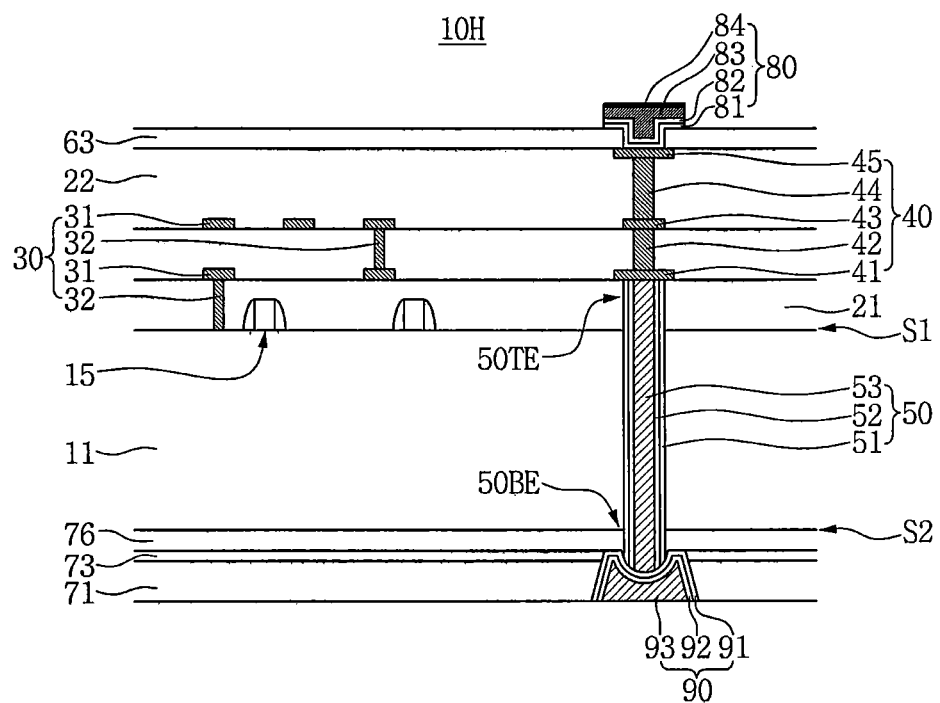

Referring to FIG. 1H, a semiconductor device 10H in accordance with an embodiment of the inventive concepts may include a MOS transistor 15, a first interlayer insulating layer 21, an inner circuit 30, a TSV connection circuit 40, a second interlayer insulating layer 22, a front-side passivation layer 63, a front-side bumping pad 80 on a front-side S1 of a substrate 11, a TSV structure 50 vertically passing through the substrate 11 and the first interlayer insulating layer 21, a back-side buffer layer 76, a back-side blocking layer 73 on the back-side buffer layer 76, a back-side insulating layer 71 on the back-side blocking layer 73, and a back-side bumping pad 90 buried in the back-side insulating layer 71 and the back-side blocking layer 73, and being in contact with an upper surface of the back-side buffer layer on a back-side S2 of the substrate 11. The back-side bumping pad 90 will be described with reference to FIG. 2H in more detail.

FIGS. 2A to 2H are enlarged views schematically illustrating bumping pads of semiconductor devices in accordance with embodiments of the inventive concepts.

Figure 2A:
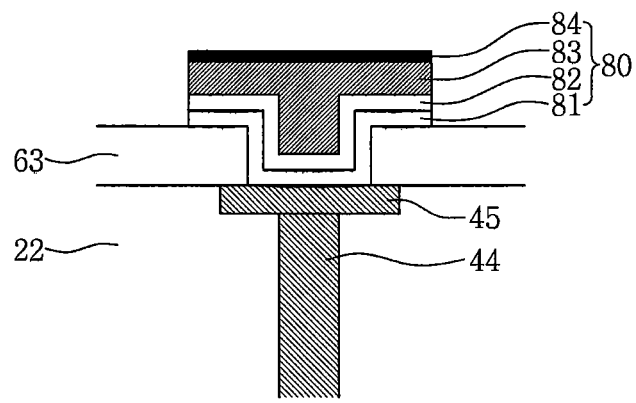
FIGS. 2A through 2H are enlarged views schematically illustrating bumping pads of semiconductor devices in accordance with embodiments of the inventive concepts.

Referring to FIG. 2A, the semiconductor devices 10A and 10B in accordance with the embodiments of the inventive concepts may include the front-side bumping pad 80 disposed on the front-side passivation layer 63 to be connected with the TSV IO pad 45.

The front-side bumping pad 80 may include the front-side pad barrier layer 81 in contact with a surface of the exposed TSV IO pad 45 and a surface of the front-side passivation layer 63, the front-side pad seed layer 82 on the front-side pad barrier layer 81, the front-side pad electrode 83 on the front-side pad seed layer 82, and the front-side pad coating layer 84 on the front-side pad electrode 83.

The front-side pad barrier layer 81 may include titanium nitride (TiN) or tantalum nitride (TaN). The front-side pad seed layer 82 may include at least one of titanium (Ti), copper (Cu), nickel (Ni), tungsten (W), or metal alloys thereof such as titanium-nickel (TiNi) or titanium-tungsten (TiW). In some embodiments, the front-side pad barrier layer 81 and the front-side pad seed layer 82 may be formed as a single layer. The front-side pad electrode 83 may include a metal such as copper (Cu) or nickel (Ni). When the front-side pad seed layer 82 and the front-side pad electrode 83 may include the same metal, a boundary between the front-side pad seed layer 82 and the front-side pad electrode 83 may be invisible and not to be distinguished. The front-side bumping pad 80 may further include a front-side pad coating layer 84 formed on a surface of the front-side pad electrode 83. The front-side pad coating layer 84 may include gold (Au).

Figure 2B:
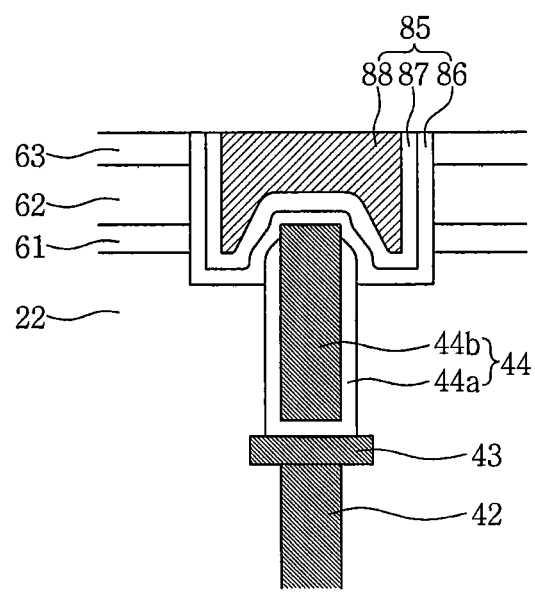

The semiconductor devices 10C and 10D in accordance with the embodiments of the inventive concepts as shown in FIG. 2B may include the front-side bumping pad 85 on an upper TSV connection via 44.

The upper TSV connection via 44 disposed on the TSV connection wire 43 may include the TSV connection via barrier layer 44a and the TSV connection via plug 44b. The TSV connection via barrier layer 44a may surround a bottom surface and sidewalls of the TSV connection via plug 44b. The TSV connection via barrier layer 44a may be in contact with the TSV connection wire 43. A top end and sidewalls of the top end of the TSV connection via plug 44b may be not covered by the TSV connection via barrier layer 44a and may be exposed by the TSV connection via barrier layer 44a. The top end of the upper TSV connection via 44 may protrude into the front-side bumping pad 85.

The semiconductor devices 10C and 10D may include the front-side capping layer 61, the front-side insulating layer 62, and the front-side passivation layer 63 formed on the second interlayer insulating layer 22 and surrounding sidewalls of the front-side bumping pad 85. The front-side capping layer 61 may include silicon nitride (SiN) and silicon carbonitride (SiCN). The front-side insulating layer 62 may include silicon oxide ($SiO_2$), and the front-side passivation layer 63 may include one of silicon nitride (SiN) or a polyimide.

The front-side bumping pad 85 may include a front-side pad barrier layer 86 directly disposed on the upper TSV connection via 44, a front-side pad seed layer 87 on the front-side pad barrier layer 86, and a front-side pad electrode 88 on the front-side pad seed layer 87.

The front-side pad barrier layer 86 may include titanium nitride (TiN) or tantalum nitride (TaN). The front-side pad seed layer 87 may include at least one of titanium (Ti), copper (Cu), nickel (Ni), tungsten (W), or metal alloys thereof such as titanium-nickel (TiNi) or titanium-tungsten (TiW). In some embodiments, the front-side pad barrier layer 86 and the front-side pad seed layer 87 may be formed as a single layer. The front-side pad electrode 88 may include a metal such as copper (Cu) or nickel (Ni). When the front-side pad seed layer 87 and the front-side pad electrode 88 include the same metal, a boundary between the front-side pad seed layer 87 and the front-side pad electrode 88 may be invisible and not to be distinguished.

A top surface of the front-side passivation layer 63 and a top surface of the front-side bumping pad 85 may be coplanar.

Figure 2C:
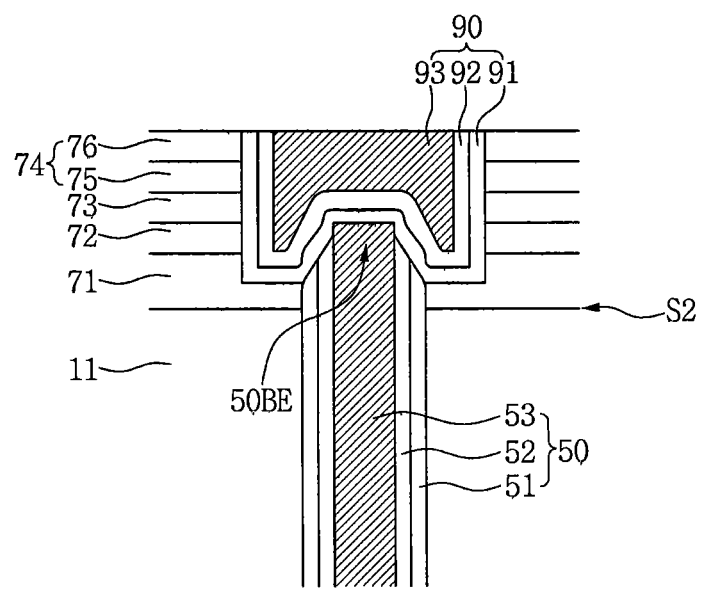

Referring to FIG. 2C, the semiconductor device 10A and 10C in accordance with the embodiments of the inventive concepts may include the back-side bumping pad 90 disposed on the bottom end 50BE of the TSV structure. The bottom end 50BE of the TSV structure 50 may protrude into the back-side bumping pad 90 from the back-side S2 of the substrate 11.

A top surface and side surfaces of the TSV plug 53 of the bottom end 50BE of the TSV structure 50 may be not covered by the TSV liner 51 and the TSV barrier layer 52 and may be exposed by the TSV liner 51 and the TSV barrier layer 52. The TSV liner 51 and TSV barrier layer 52 may be formed in side spacer shapes on side surfaces of the TSV plug 53 of the bottom end 50BE of the TSV structure 50.

The back-side pad barrier layer 91 may be in contact with the bottom end 50BE of the TSV structure 50. The back-side pad barrier layer 91 may include titanium nitride (TiN) or tantalum nitride (TaN). The back-side pad seed layer 92 may include at least one of titanium (Ti), copper (Cu), nickel (Ni), tungsten (W), or metal alloys thereof such as titanium-nickel (TiNi) or titanium-tungsten (TiW). In some embodiments, the back-side pad barrier layer 91 and the back-side pad seed layer 92 may be formed as a single layer. The back-side pad electrode 93 may include a metal such as copper (Cu) or nickel (Ni). When the back-side pad seed layer 92 and the back-side pad electrode 93 may include the same metal, a boundary between the back-side pad seed layer 92 and the back-side pad electrode 93 may be invisible and not to be distinguished.

The back-side insulating layer 71 on the back-side S2 of the substrate 11 may surround a bottom surface and side surfaces of the TSV structure 50. The back-side insulating layer 71 may include silicon oxide ($SiO_2$).

The back-side stopper layer 72, the back-side blocking layer 73, and the back-side passivation layer 74 may surround side surfaces of the back-side bumping pad 90. The back-side stopper layer 72 may include silicon nitride (SiN), the back-side blocking layer 73 may include silicon carbonitride (SiCN), and the back-side passivation layer 74 may include silicon nitride (SiN) or a polyimide.

Top surfaces of the back-side bumping pad 90 and the back-side passivation layer 74 may be coplanar.

Figure 2D:
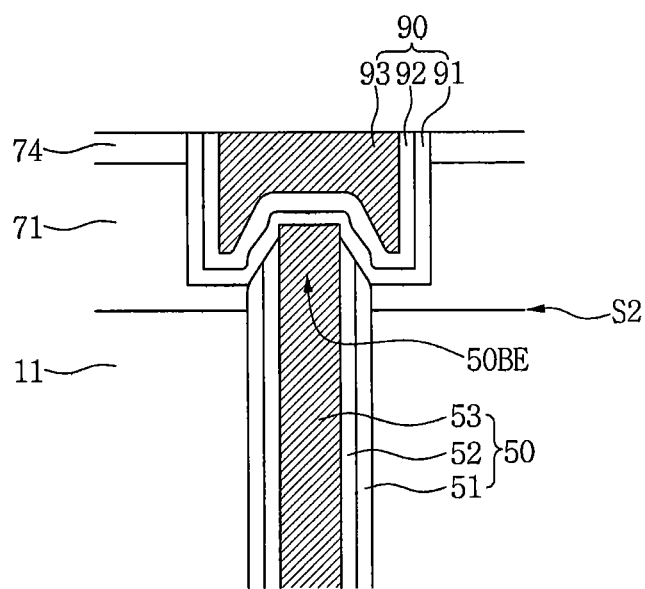

Referring to FIG. 2D, the semiconductor devices 10B and 10D in accordance with embodiments of the inventive concepts may include the back-side bumping pad 90 disposed on the bottom end 50BE of the TSV structure 50. The bottom end 50BE of the TSV structure 50 may protrude from the back-side S2 of the substrate 11 into inside of the back-side bumping pad 90.

The back-side insulating layer 71 on the back-side S2 of the substrate 11 may surround the bottom surface and the side surfaces of the TSV structure 50. The back-side insulating layer 71 may include silicon oxide ($SiO_2$).

The back-side passivation layer 74 may surround side surfaces of the back-side bumping pad 90. The back-side passivation layer 74 may include silicon nitride (SiN) or a polyimide.

Top surfaces of the back-side bumping pad 90 and the back-side passivation layer 74 may be coplanar.

Figure 2E:
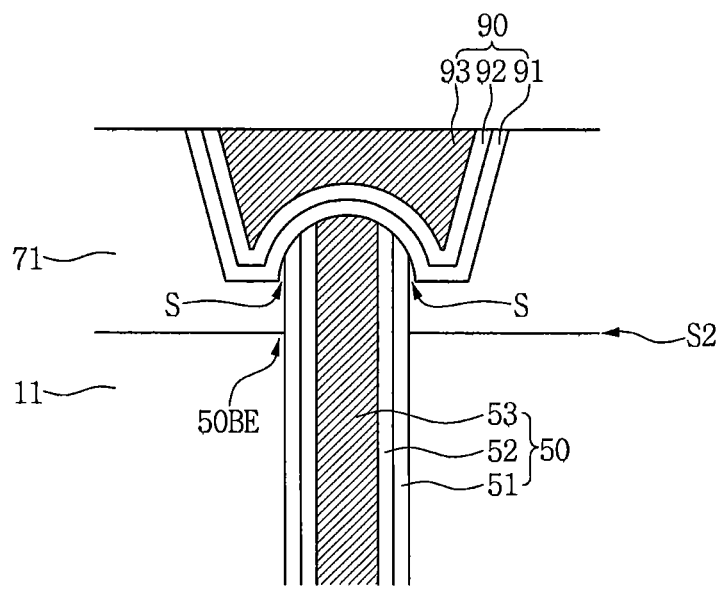

Referring to the FIG. 2E, the semiconductor device 10E may include the back-side bumping pad 90 buried in the back-side insulating layer 71 on the back-side S2 of the substrate 11. The back-side bumping pad 90 may have sloped side surfaces. A portion of the back-side insulating layer 71 may remain as a spacer S between the lower portion of the back-side bumping pad 90 and the bottom end 50BE of the TSV structure 90.

Figure 2F:
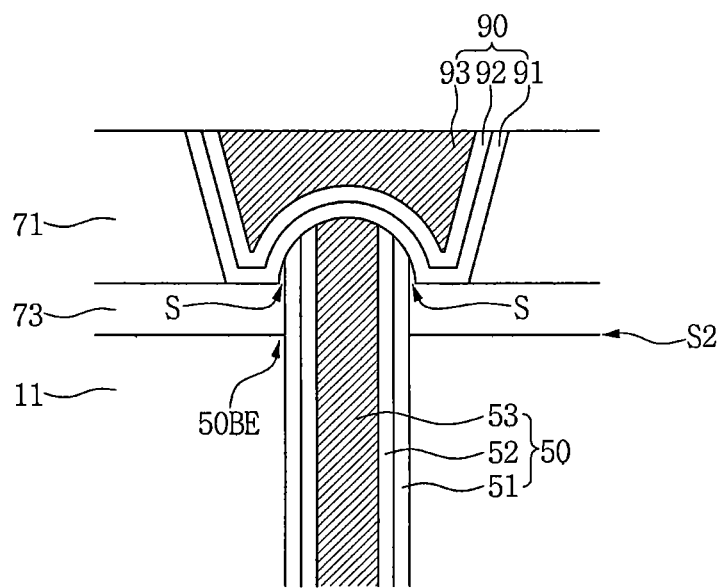

Referring to FIG. 2F, the semiconductor device 10F in accordance with the embodiment of the inventive concepts may include the back-side blocking layer 73 on the back-side S2 of the substrate 11, the back-side insulating layer 71 on the back-side blocking layer 73, and back-side bumping pad 90 buried in the back-side insulating layer. The back-side bumping pad 90 may have sloped side surfaces. A portion of the back-side blocking layer 73 may remain as a spacer S between the lower portion of the back-side bumping pad 90 and the bottom end 50BE of the TSV structure 50. The lower portion of the back-side bumping pad 90 may be in contact with the back-side blocking layer 73.

Figure 2G:
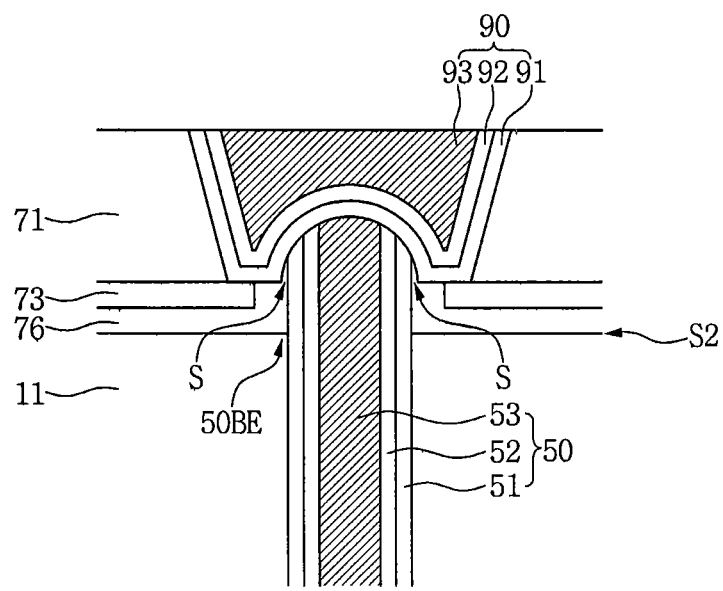

Referring to FIG. 2G, the semiconductor device 10G in accordance with the embodiment of the inventive concepts may include back-side buffer layer 76 on the back-side S2 of the substrate 11, the back-side blocking layer 73 on the back-side buffer layer 76, the back-side insulating layer 71 on the back-side blocking layer 73, and the back-side bumping pad 90 buried in the back-side insulating layer 71. The back-side bumping pad 90 may have sloped side surfaces. A portion of the back-side buffer layer 76 may remain as a spacer S between the lower portion of the back-side bumping pad 90 and the bottom end 50BE of the TSV structure 50. The lower portion of the back-side bumping pad 90 may be in contact with the back-side blocking layer 73. The back-side buffer layer 76 may include silicon oxide ($SiO_2$).

Figure 2H:
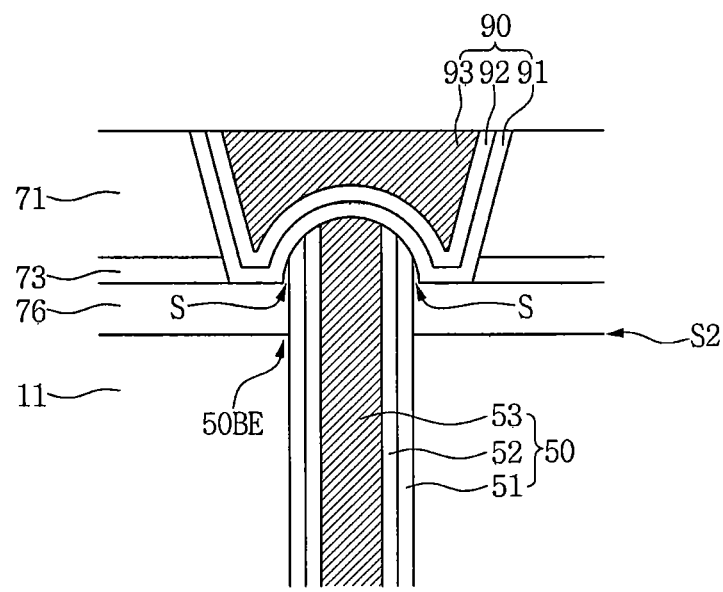

Referring to FIG. 2H, the semiconductor device 10H in accordance with the embodiment of the inventive concepts may include the back-side buffer layer 76 on the back-side S2 of the substrate 11, the back-side blocking layer 73 on the back-side buffer layer 76, and the back-side bumping pad 90 buried in the back-side insulating layer 71 and the back-side blocking layer 73. The back-side bumping pad 90 may have sloped side surfaces. A portion of the back-side buffer layer 76 may remain as a spacer S between the lower portion of the back-side bumping pad 90 and the bottom end 50BE of the TSV structure 50. Side surfaces of the back-side bumping pad 90 may be in contact with the back-side blocking layer 73, and a bottom surface of the back-side bumping pad 90 may be in contact with the back-side buffer layer 76.

Figure 3A:
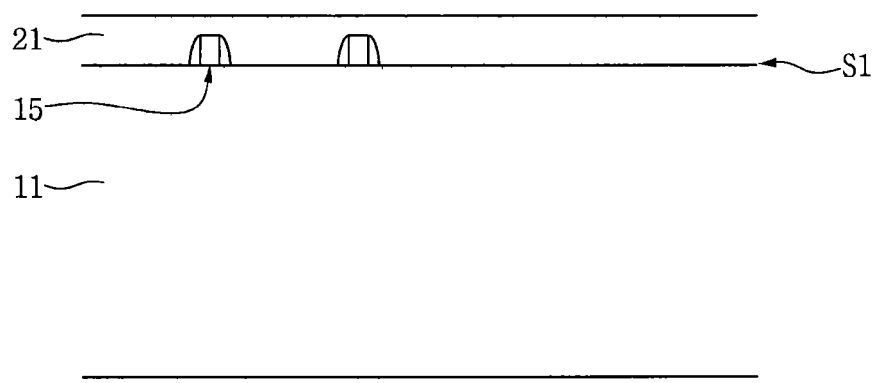
FIGS. 3A through 9C are cross-sectional views showing methods of fabricating semiconductor devices in accordance with embodiments of the inventive concepts.
Figure 3B:
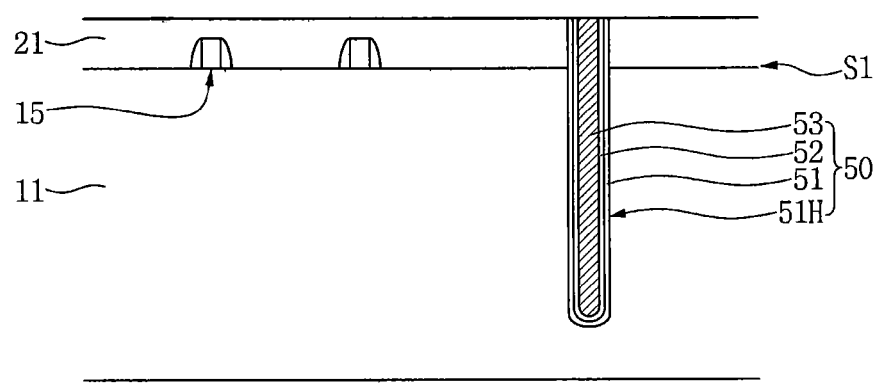
Figure 3C:
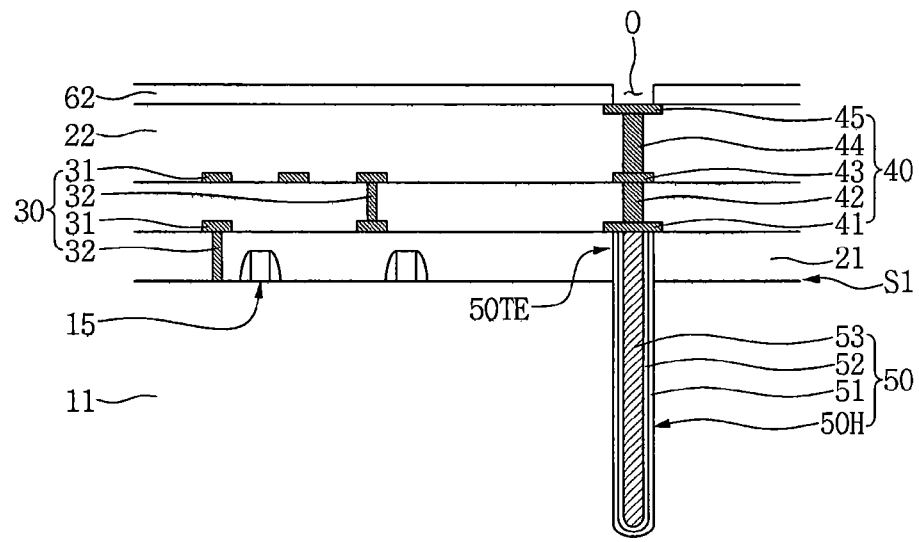
Figure 3D:
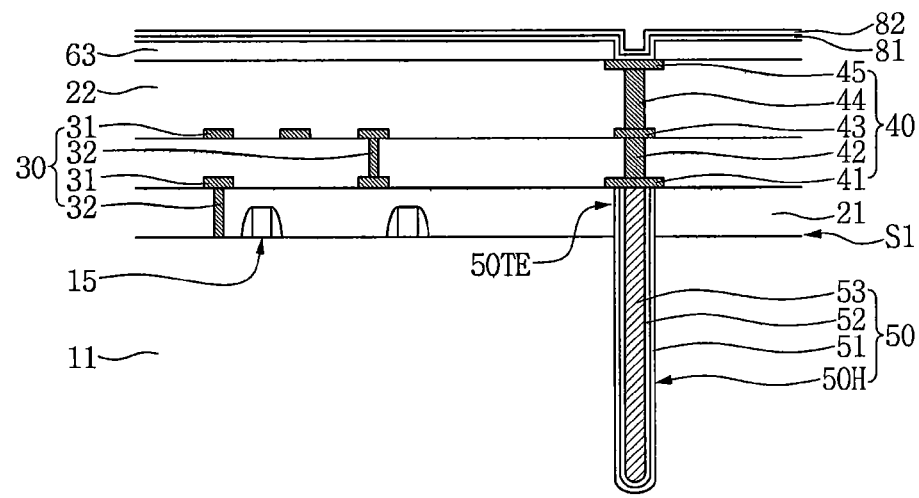
Figure 3E:
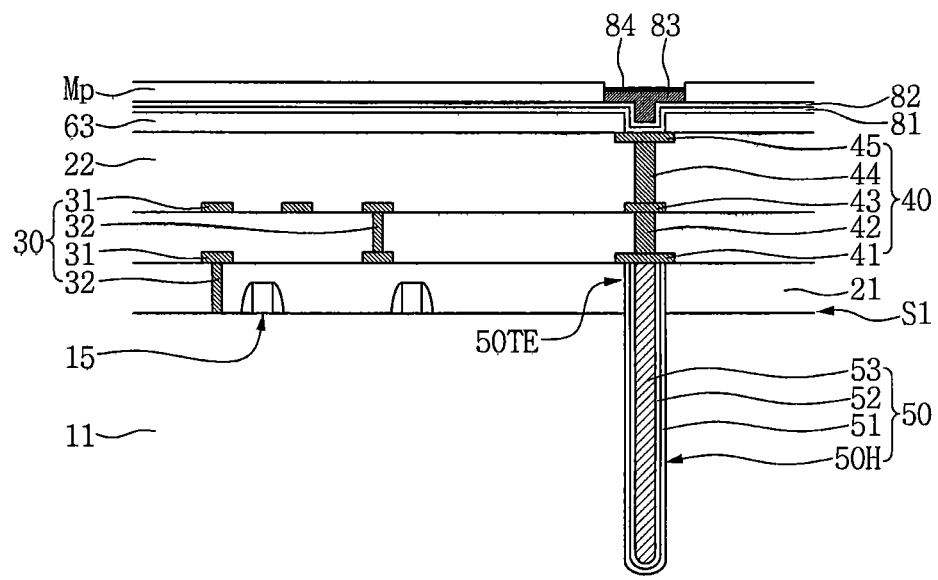
Figure 3F:
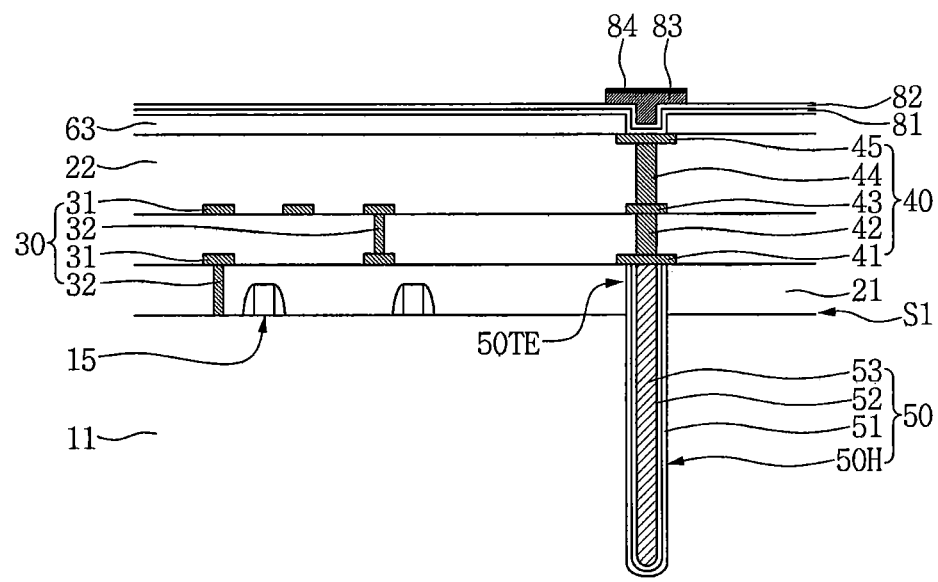
Figure 3G:
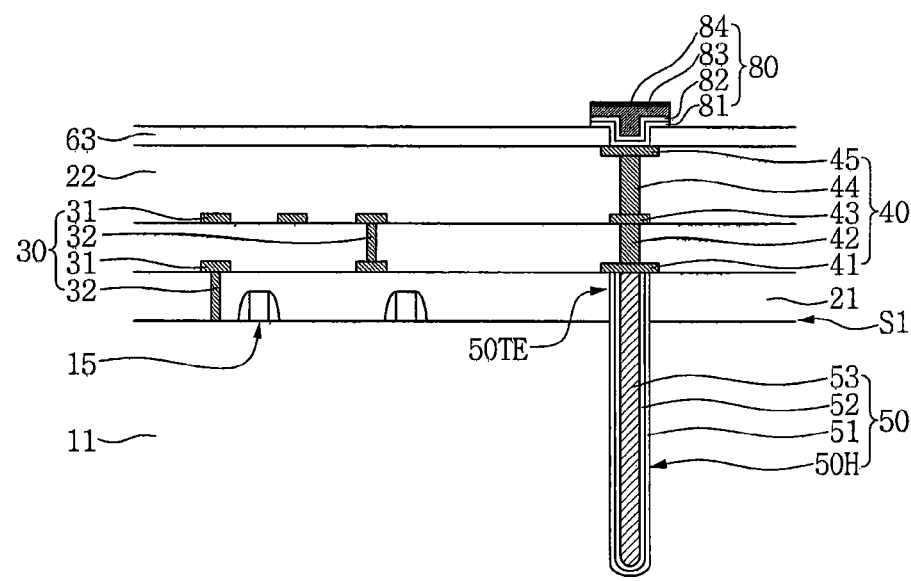
Figure 3H:
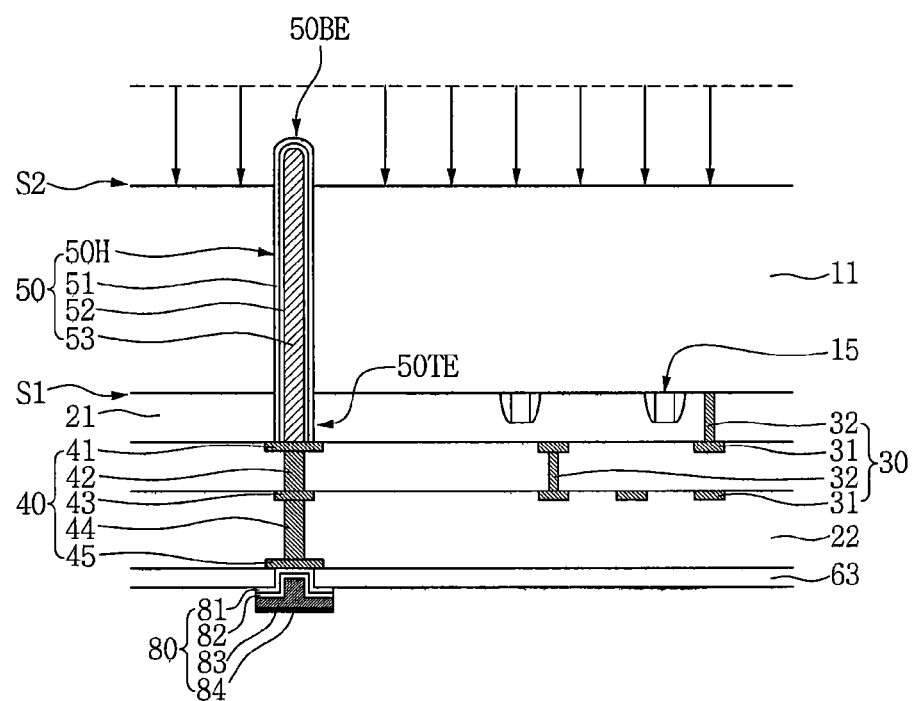
Figure 3I:
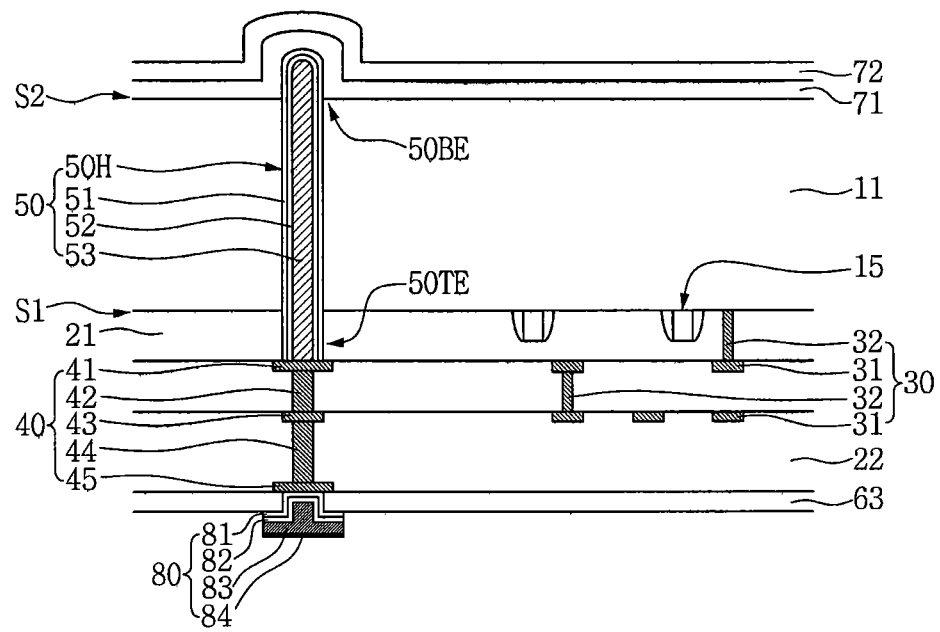
Figure 3J:
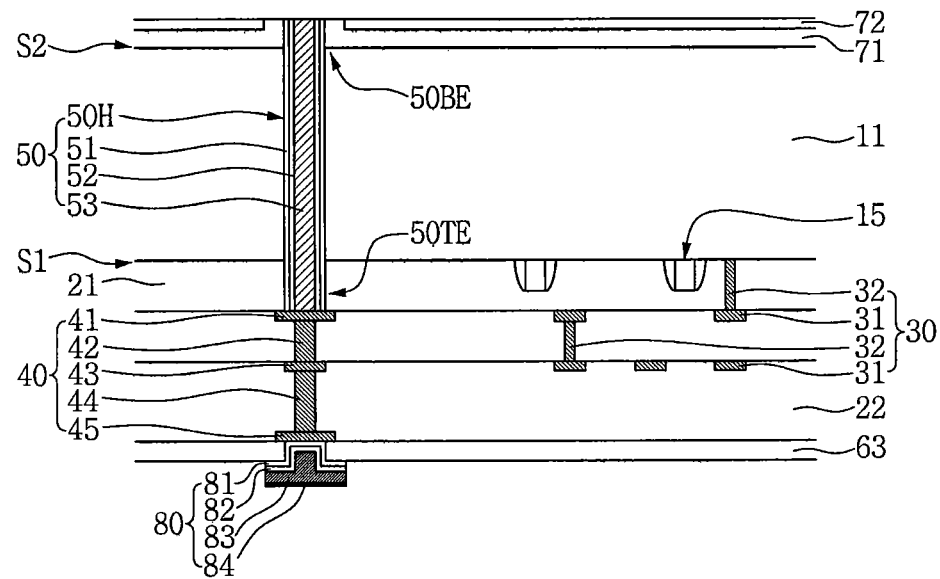
Figure 3K:
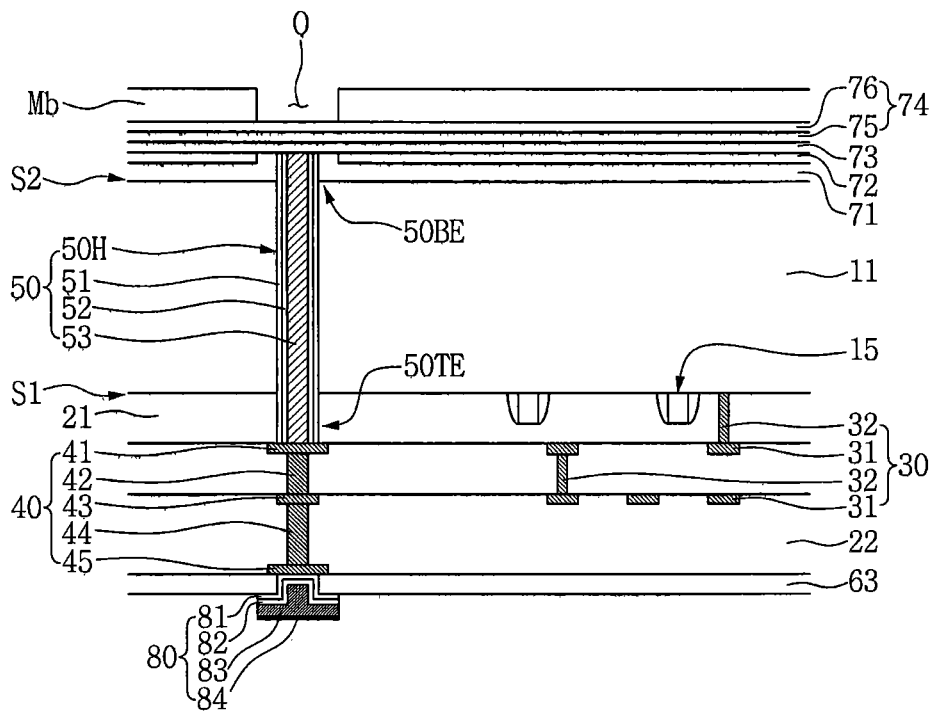
Figure 3L:
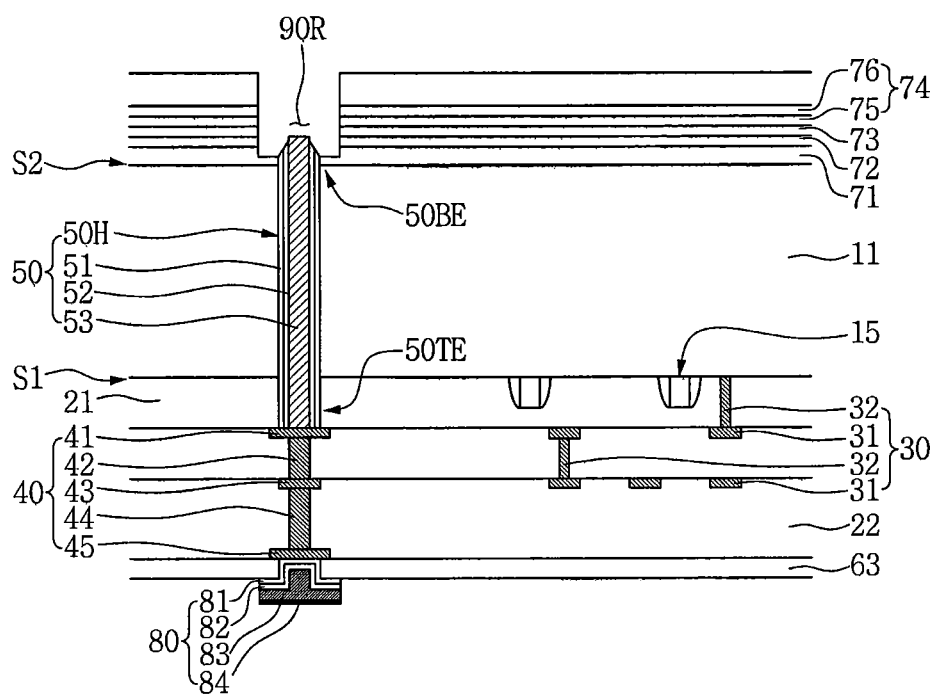
Figure 3M:
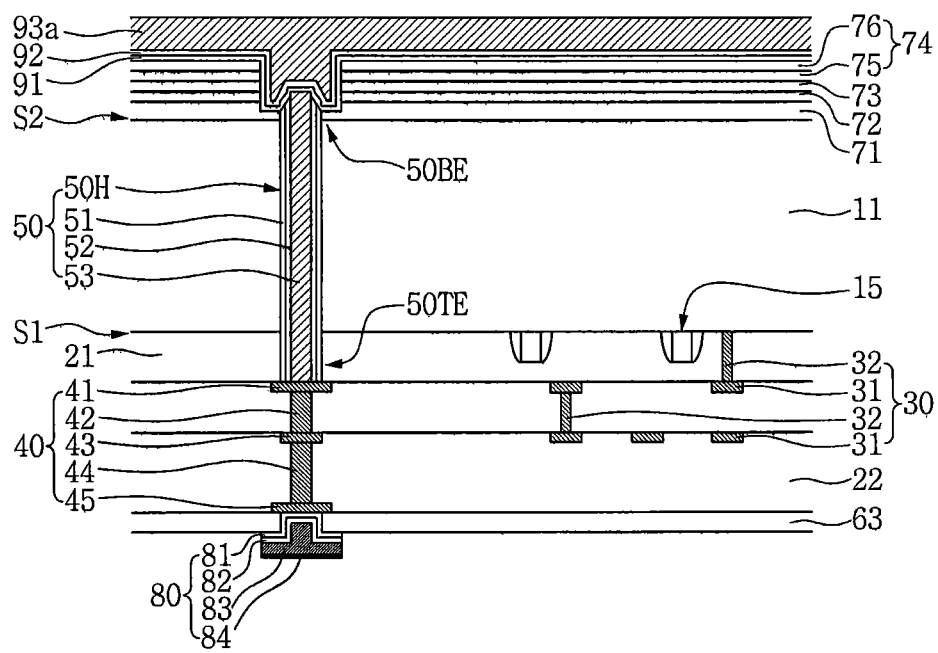
Figure 3N:
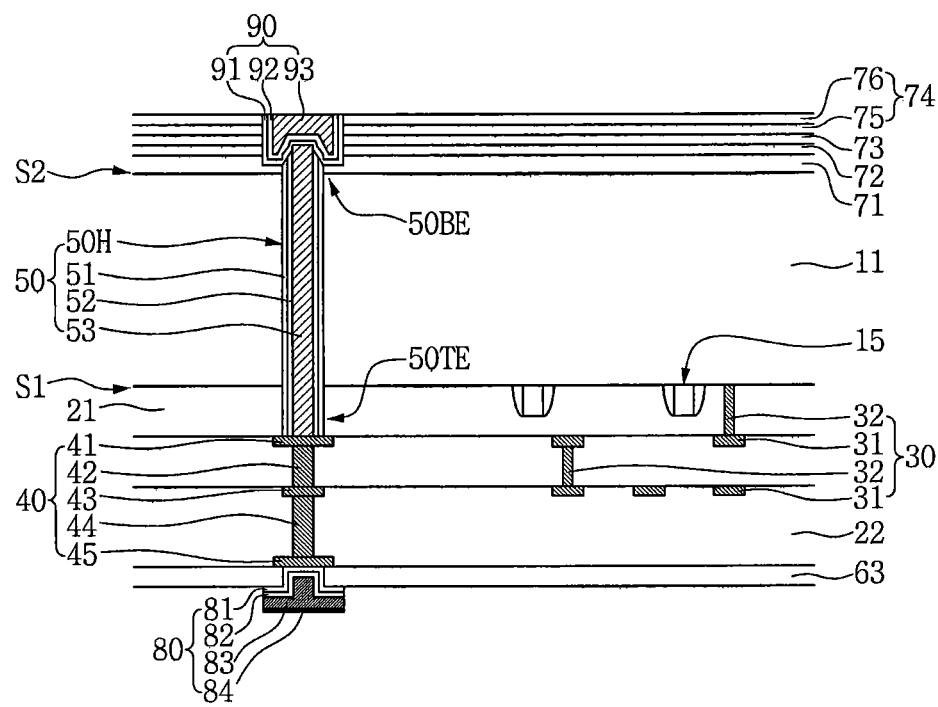

FIGS. 3A to 3N are cross-sectional views showing a method of fabricating a semiconductor device in accordance with an embodiment of the inventive concepts.

Referring to FIG. 3A, a method of fabricating a semiconductor device in accordance with an embodiment of the inventive concepts may include preparing a substrate 11, forming MOS transistors 15 on a front-side S1 of the substrate 11, and forming a first interlayer insulating layer 21 covering the MOS transistors 15 and the front-side S1 of the substrate 11.

The substrate 11 may include one of a single crystalline wafer, a SiGe wafer, or an SOI wafer.

The first interlayer insulating layer 21 may include at least one of silicon oxide ($SiO_2$), silicon oxycarbide (SiOC), silicon nitride (SiN), silicon carbonitride (SiCN), or other insulating materials which are formed using depositing processes.

Referring to FIG. 3B, the method may include forming a TSV structure vertically passing through the first interlayer insulating layer 21 and the substrate 11.

The forming the TSV structure 50 may include etching the first interlayer insulating layer 21 and the substrate 11 to form a TSV hole 50H in the first interlayer insulating layer 21 and the substrate 11, conformally forming a TSV liner 51 on inner walls of the TSV hole 50H, conformally forming a TSV barrier layer 52 on the TSV liner 51, and forming a TSV plug 53 on the TSV barrier layer 52 to fill the TSV hole 50H.

The TSV liner 51 may include silicon oxide ($SiO_2$) formed by performing a chemical vapor deposition (CVD) process, the TSV barrier layer 52 may include titanium nitride (TiN) or tantalum nitride (TaN), and the TSV plug 53 may include copper (Cu). The method may include planarizing a top surface of the TSV structure 50 and a top surface of the first interlayer insulating layer 21 to be coplanar by performing a chemical mechanical polishing (CMP) process.

Referring to FIG. 3C, the method may include forming an inner circuit 30, a TSV connection circuit 40, a second interlayer insulating layer 22, and a back-side passivation layer 74.

The inner circuit 30 may include inner wires 31 extending in a horizontal direction and inner vias 32 extending in a vertical direction which formed by performing a photolithography process, an etching process, a deposition process, a electroplating process, and/or a planarization process. The inner circuit 30 may be electrically connected with the substrate 11 and the MOS transistors 15.

The TSV connection circuit 40 may include a TSV connection pad 41, a lower TSV connection via 42, a TSV connection wire 43, an upper TSV connection via 44, and a TSV JO (input/output) pad 45 which are formed by performing a photolithography process, an etching process, a deposition process, an electroplating process, and/or a planarization process. The TSV connection pad 41 may be formed on the first interlayer insulating layer 21 to be in contact with a top end 50TE of the TSV structure 50. The TSV connection wire 43 may be disposed at the same level as one of the inner wires 31. The TSV IO pad 45 may be disposed at the same level as the highest one of the inner circuit 30 and the TSV connection circuit 40. The lower TSV connection via 42 may electrically connect the TSV connection pad 41 to the TSV connection wire 43, and the upper TSV connection via 44 may electrically connect the TSV connection wire 43 to the TSV IO pad 45.

The inner circuit 30 and the TSV connection circuit 40 may include a conductive material. For example, the inner circuit 30 and the TSV connection circuit 40 may include at least one of metals such as tungsten (W), copper (Cu), nickel (Ni), or titanium (Ti), metal compounds such as titanium nitride (TiN), tantalum nitride (TaN), or tungsten nitride (WN), or metal silicides such as titanium silicide (TiSi), tungsten silicide (WSi), cobalt silicide (CoSi), or nickel silicide (NiSi). In some embodiments, the TSV IO pad 45 may include aluminum (Al) to be in contact with a probe of a test apparatus.

The second interlayer insulating layer 22 may include at least one of silicon oxide ($SiO_2$), silicon oxycarbide (SiOC), silicon nitride (SiN), silicon carbonitride (SiCN), or another insulating material.

The front-side passivation layer 63 may have an opening O which exposes a top surface of the TSV IO pad 45. The front-side passivation layer 63 may include silicon nitride (SiN), a polyimide, or a combination thereof.

Referring to FIG. 3D, the method may include conformally forming a front-side pad barrier layer 81 and a front-side pad seed layer 82 on the front-side passivation layer 63 and the TSV IO pad 45 exposed in the opening O.

The front-side pad barrier layer 81 and the front-side pad seed layer 82 may be formed by performing a physical vapor deposition (PVD) process such as a sputtering process or a metal organic chemical mechanical deposition (MOCVD) process. The front-side pad barrier layer 81 may include titanium nitride (TiN) or tantalum nitride (TaN). The front-side pad seed layer 82 may include at least one of titanium (Ti), copper (Cu), nickel (Ni), tungsten (W), or metal alloys such as titanium-nickel (TiNi) or titanium-tungsten (TiW). In some embodiments, the front-side pad barrier layer 81 and the front-side pad seed layer 82 may be formed as a single layer.

Referring to FIG. 3E, the method may include forming a plating mask pattern Mp, and performing an electroplating process to form a front-side pad electrode 83. The plating mask pattern Mp may include a photoresist. The front-side pad electrode 83 may include copper (Cu) or nickel (Ni).

In some embodiments, the method may include forming a front-side pad coating layer 84 on a top surface of the front-side pad electrode 83. The front-side pad coating layer 84 may include gold (Au).

Referring to FIG. 3F, the method may include removing the plating mask pattern Mp to expose the front-side pad seed layer 82. The plating mask pattern Mp may be removed by performing an ashing process using oxygen ($O_2$) plasma.

Referring to FIG. 3G, the method may include removing the exposed front-side pad seed layer 82 and the front-side pad barrier layer 81 therebeneath to form a front-side bumping pad 80. The removing the front-side pad seed layer 82 and the front-side pad barrier layer 81 may include performing a wet etch process.

Referring to FIG. 3H, the method may include overturning the substrate 11 and recessing a back-side S2 of the substrate 11 so as to expose a bottom end 50BE of the TSV structure 50 which protrudes from the back-side S2. The recessing the back-side S2 may include performing a silicon etching process.

Referring to FIG. 3I, the method may include performing a CVD process to form a back-side insulating layer 71 and a back-side stopper layer 72 so as to cover the bottom end 50BE of the TSV structure 50 which protrudes from the back-side S2 of the substrate 11. The back-side insulating layer 71 may include silicon oxide ($SiO_2$), and the back-side stopper layer 72 may include silicon nitride (SiN).

Referring to FIG. 3J, the method may include performing a CMP process to planarize the bottom end 50BE of the TSV structure 50, the back-side stopper layer 72, and the back-side insulating layer 71. Accordingly, top surfaces of the bottom end 50BE of the TSV structure 50, the back-side stopper layer 72, and the back-side insulating layer 71 may be coplanar. The back-side stopper layer 72 may not be in contact with the TSV structure 50. The back-side insulating layer 71 may only surround side surfaces of the TSV structure 50. The CMP process may be performed using a flat portion of the back-side stopper layer 72 as a CMP stopping layer.

Referring to FIG. 3K, the method may include conformally forming a back-side blocking layer 73 and a back-side passivation layer 74 on the planarized top surfaces of the bottom end 50BE of the TSV structure 50, the back-side stopper layer 72, and the back-side insulating layer 71, and forming a back-side pad mask pattern Mb on the back-side passivation layer 74.

The back-side blocking layer 73 may block movement and diffusion of atoms of the TSV structure 50 and the back-side insulating layer 71. The back-side blocking layer 73 may include silicon nitride (SiN) containing carbon (C) such as silicon carbonitride (SiCN).

The back-side passivation layer 74 may include a lower back-side passivation layer 75 and an upper back-side passivation layer 76. The lower back-side passivation layer 75 may include silicon oxide ($SiO_2$) and the upper back-side passivation layer 76 may include silicon nitride (SiN). The lower back-side passivation layer 75 may provide flexibility to the semiconductor device, and the upper back-side passivation layer 76 may be used as a stopping layer while a subsequent CMP process is performed.

The back-side pad mask pattern Mb may have an opening O aligned with the bottom end 50BE of the TSV structure 50. The back-side pad mask pattern Mb may include a photoresist.

Referring to FIG. 3L, the method may include performing an etching process using the back-side pad mask pattern Mb as an etch mask to form a back-side pad recess 90R exposing the bottom end 50BE of the TSV structure 50. A periphery of the exposed bottom end 50BE of the TSV structure 50 may be over-recessed. The TSV barrier layer 52 and the TSV liner 51 on a top surface of the TSV plug 53 of the exposed bottom end 50BE of the TSV structure 50 may be removed. The TSV barrier layer 52 and the TSV liner 51 on side surfaces of the TSV plug 53 of the exposed bottom end 50BE of the TSV structure 50 may remain as side spacers. The remaining TSV barrier layer 52 and the remaining TSV liner 51 may have a ring shape or a disk shape in a plan view. Successively, the back-side pad mask pattern Mb may be removed by performing an ashing process using oxygen (O2) plasma.

Referring to FIG. 3M, the method may include forming a back-side pad barrier layer 91, a back-side pad seed layer 92, and a back-side pad electrode layer 93a in the back-side pad recess 90R. The back-side pad barrier layer 91 and the back-side pad seed layer 92 may be formed by performing a PVD process such a sputtering process or a MOCVD process. The back-side pad barrier layer 91 may include titanium nitride (TiN) or tantalum nitride (TaN). The back-side pad seed layer 92 may include at least one of titanium (Ti), copper (Cu), nickel (Ni), tungsten (W), or metal alloys thereon such as titanium-nickel (TiNi) or titanium-tungsten (TiW). In some embodiments, the back-side pad barrier layer 91 and the back-side pad seed layer 92 may be formed as a single layer. The back-side pad electrode layer 93a may be formed using one of an electroplating process, a PVD process, or a CVD process. The back-side pad electrode layer 93a may include a metal such as copper (Cu) or nickel (Ni). When the back-side pad seed layer 92 and the back-side pad electrode layer 93a may include the same metal, a boundary between the back-side pad seed layer 92 and the back-side pad electrode layer 93a may be invisible and not to be distinguished.

Referring to FIG. 3N, the method may include forming a back-side bumping pad 90 by performing a CMP process to planarize top surfaces of the back-side pad electrode layer 93a, the back-side pad seed layer 92, the back-side pad barrier layer 91, and the upper back-side passivation layer 76.

Figure 4A:
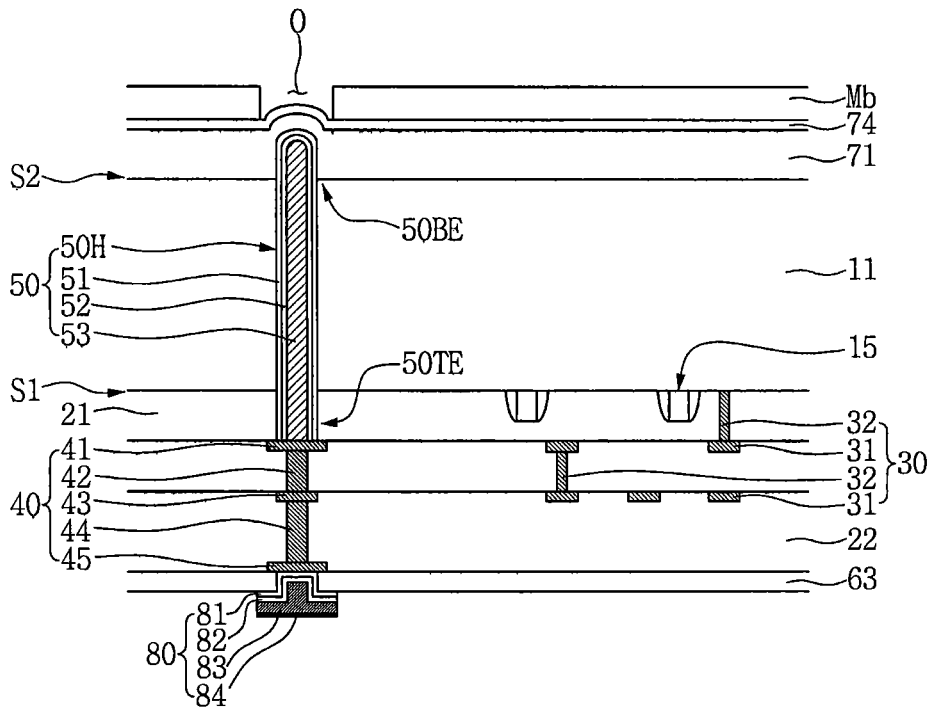
Figure 4B:
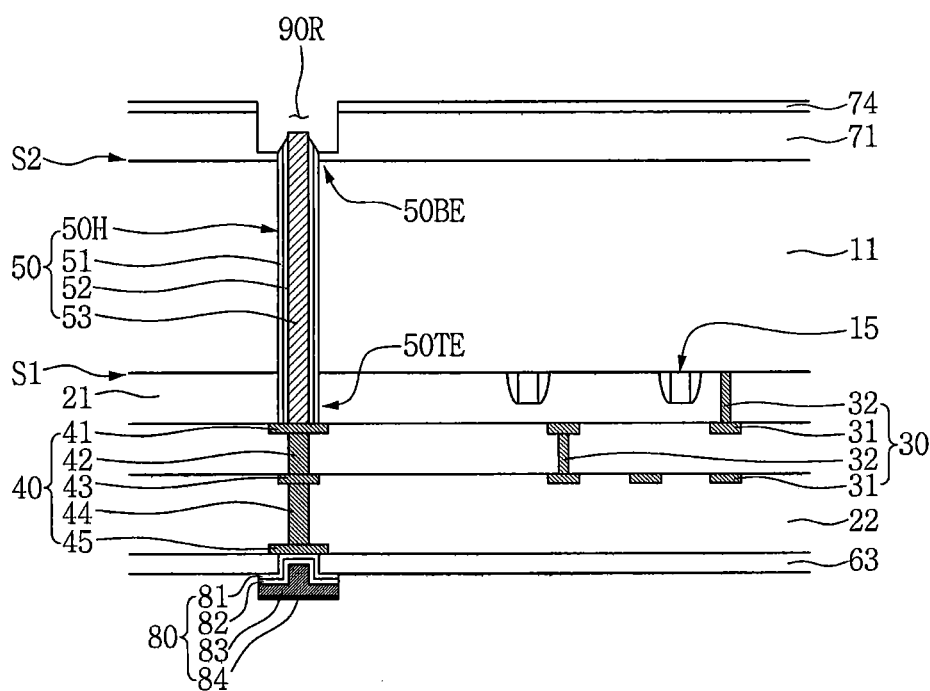
Figure 4C:
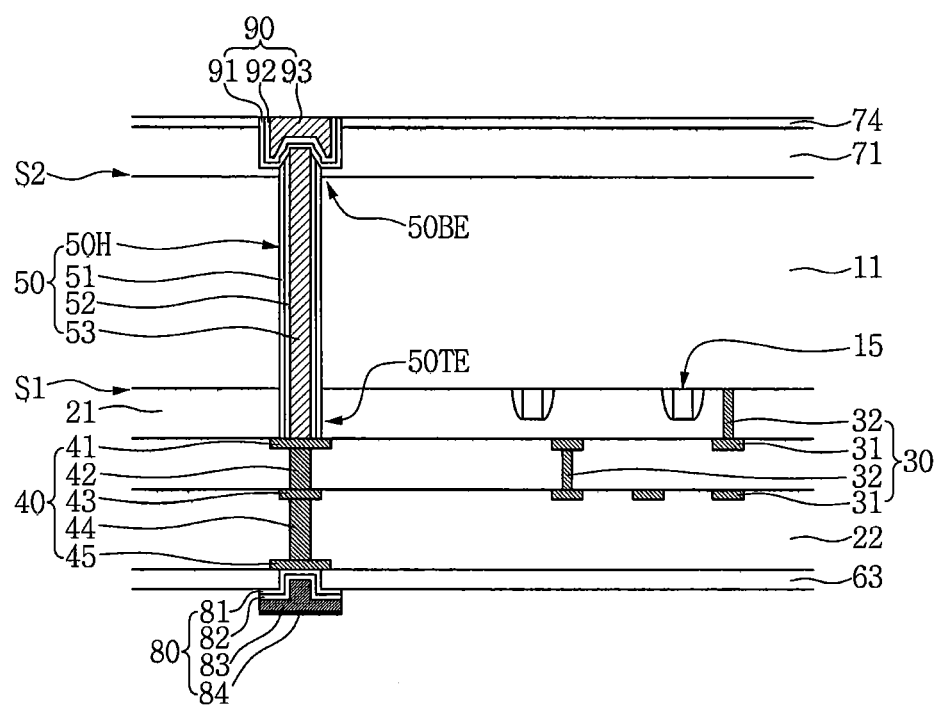

FIGS. 4A to 4C are cross-sectional views showing a method of fabricating a semiconductor device in accordance with an embodiment of the inventive concepts.

Referring to FIG. 4A, a method of fabricating a semiconductor device in accordance with an embodiment of the inventive concepts may include performing the processes described with reference to FIGS. 3A to 3H to form a back-side insulating layer 71 and a back-side passivation layer 74 to cover a bottom end 50BE of a TSV structure 50 protruding from a back-side S2 of a substrate 11, and a back-side pad mask pattern Mb. The back-side pad mask pattern Mb may have an opening O aligned with the bottom end 50BE of the TSV structure 50.

Referring to FIG. 4B, the method may include performing an etching process using the back-side pad mask pattern Mb as an etch mask to form a back-side pad recess 90R exposing the bottom end 50BE of the TSV structure 50. Successively, the method may include removing the back-side pad mask pattern Mb.

Referring to FIG. 4C, the method may include forming a back-side pad barrier layer 91, a back-side pad seed layer 92, and a back-side pad electrode layer 93a in the back-side pad recess 90R, and forming a back-side bumping pad 90 by planarizing top surfaces of the back-side pad electrode layer 93a, the back-side pad seed layer 92, the back-side pad barrier layer 91, and the back-side passivation layer 76 by performing a CMP process.

FIGS. 5A to 5D are cross-sectional views showing a method of fabricating a semiconductor device in accordance with an embodiment of the inventive concepts.

Figure 5A:
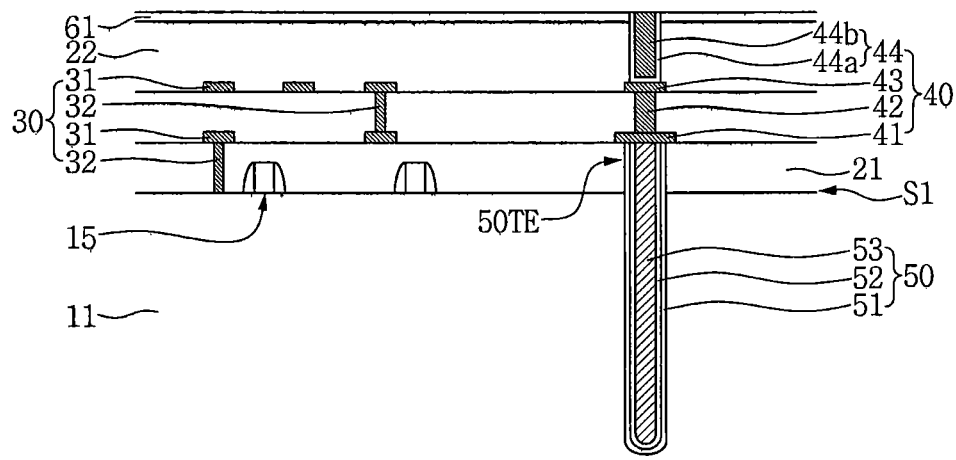

Referring to FIG. 5A, a method of fabricating a semiconductor device in accordance with an embodiment of the inventive concepts may include performing the processes described with reference to FIGS. 3A to 3C to form a TSV structure 50, an inner circuit 30, a TSV connection circuit 40, and a second interlayer insulating layer 22.

The TSV connection circuit 40 may include a TSV connection pad 41, a lower TSV connection via 42, a TSV connection wire 43, and an upper TSV connection via 44. Comparing with FIG. 3C, the TSV 10 pad 45 may be omitted. The upper TSV connection via 44 may include a TSV connection via barrier layer 44a and a TSV connection via plug 44b. The TSV connection via barrier layer 44a may include titanium nitride (TiN) or tantalum nitride (TaN). The TSV connection via plug 44b may include copper (Cu) or tungsten (W).

The method may further include forming a front-side capping layer 61 on the second interlayer insulating layer 22. Top surfaces of the front-side capping layer 61 and TSV JO pad 45 may be coplanar. The front-side capping layer 61 may include silicon nitride (SiN). The upper TSV connection via 44 may be planarized using the front-side capping layer 61 as a CMP stopping layer. Non-described elements will be understood with reference to FIG. 3A to 3C.

Figure 5B:
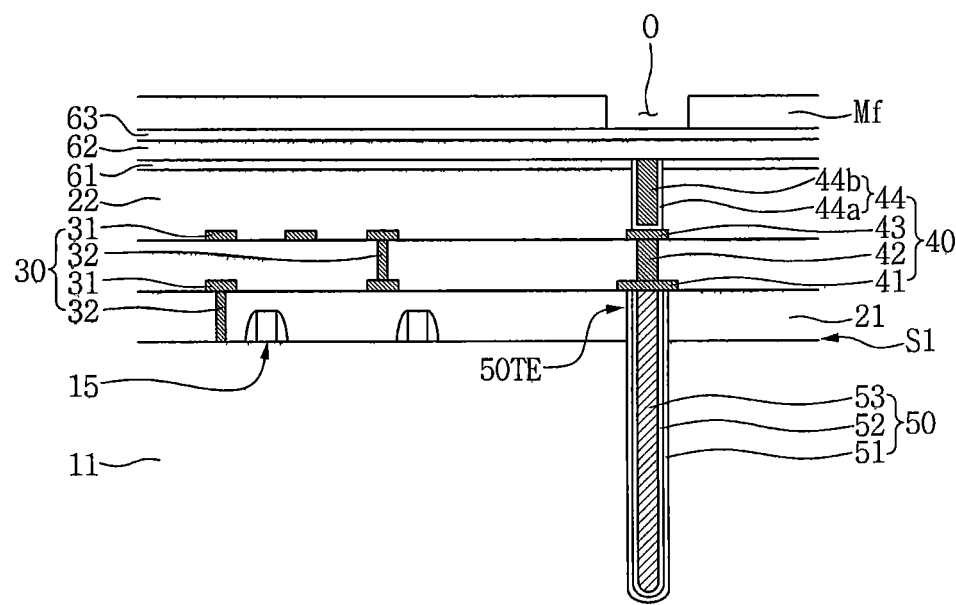

Referring to FIG. 5B, the method may include forming a front-side insulating layer 62 and a front-side passivation layer 63 on the front-side capping layer 61 and the upper TSV connection via 44, and forming a front-side pad mask pattern Mf on the front-side passivation layer 63. The front-side insulating layer 62 may include silicon oxide ($SiO_2$), and the front-side passivation layer 63 may include silicon nitride (SiN). The front-side pad mask pattern Mf may include an opening O aligned with the upper TSV connection via 44. The front-side pad mask pattern Mf may include a photoresist.

Figure 5C:
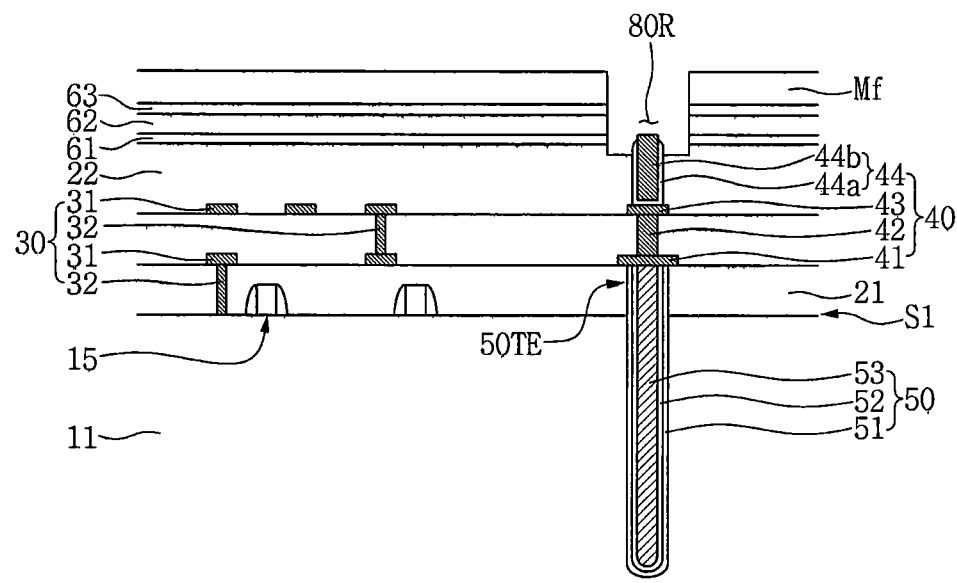

Referring to FIG. 5C, the method may include forming a front-side pad recess 80R exposing a top end of the upper TSV connection via 44 by performing an etching process using the front-side pad mask pattern Mf as an etch mask. The top end of the upper TSV connection via 44 may protrude in the front-side pad recess 80R. The TSV connection via barrier layer 44a of the upper TSV connection via 44 may be partially removed. Accordingly, top portions of side surfaces of the upper TSV connection via 44 may be exposed. Successively, the front-side pad mask pattern Mf may be removed.

Figure 5D:
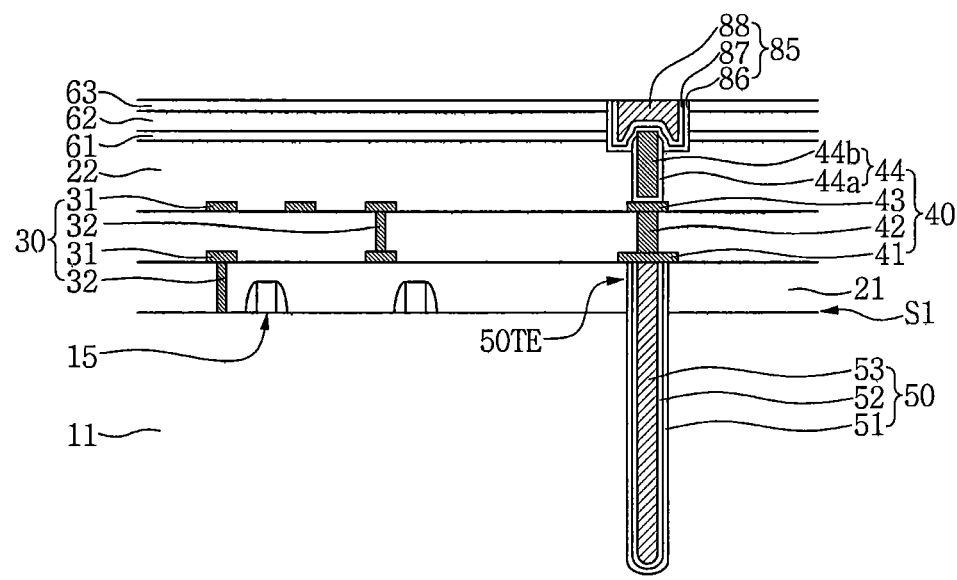

Referring to FIG. 5D, the method may include, performing the processes described with reference to FIGS. 3M and 3N, and forming a front-side bumping pad 85. The front-side bumping pad 85 may include a front-side pad barrier layer 86, a front-side pad seed layer 87, and a front-side pad electrode 88. The front-side pad barrier layer 86 and the front-side pad seed layer 87 may be formed by performing a PVD process such as a sputtering process or a MOCVD process. The front-side pad barrier layer 86 may include titanium nitride (TiN) and tantalum nitride (TaN). The front-side pad seed layer 87 may include at least one of titanium (Ti), copper (Cu), nickel (Ni), tungsten (W), or metal alloys thereof such as titanium-nickel (TiNi) or titanium-tungsten (TiW). In some embodiments, the front-side pad barrier layer 86 and the front-side pad seed layer 87 may be formed as a single layer. The front-side pad electrode layer 88 may be formed by performing one of an electroplating process, a PVD process, or a CVD process. The front-side pad electrode layer 88 may a metal such as copper (Cu) or nickel (Ni). When the front-side pad seed layer 87 and the front-side pad electrode layer 88 may include the same metal, a boundary between the front-side pad seed layer 87 and the front-side pad electrode layer 88 may be invisible and not to be distinguished.

Successively, the method may include performing the processes described with reference to FIGS. 3H to 3N.

Figure 6A:
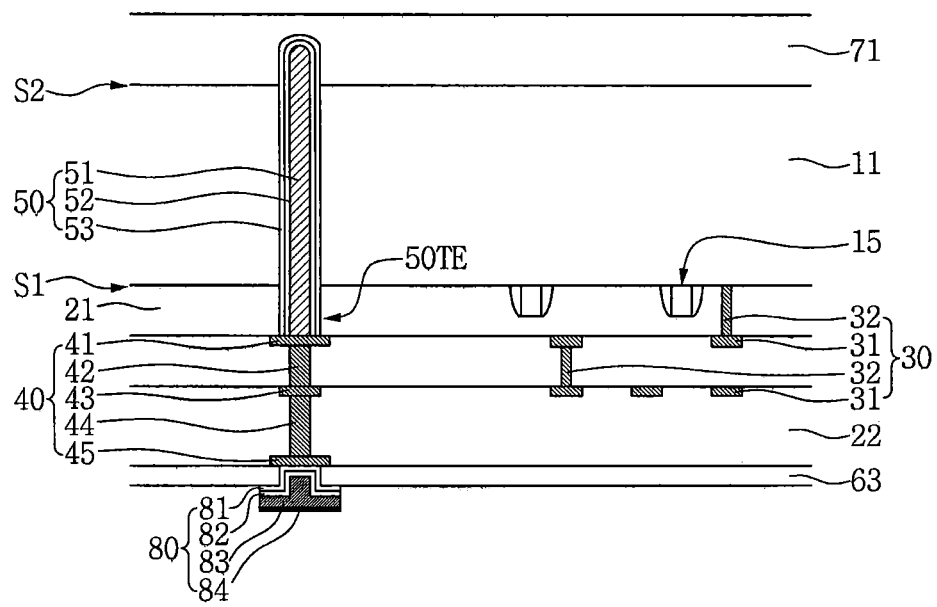
Figure 6B:
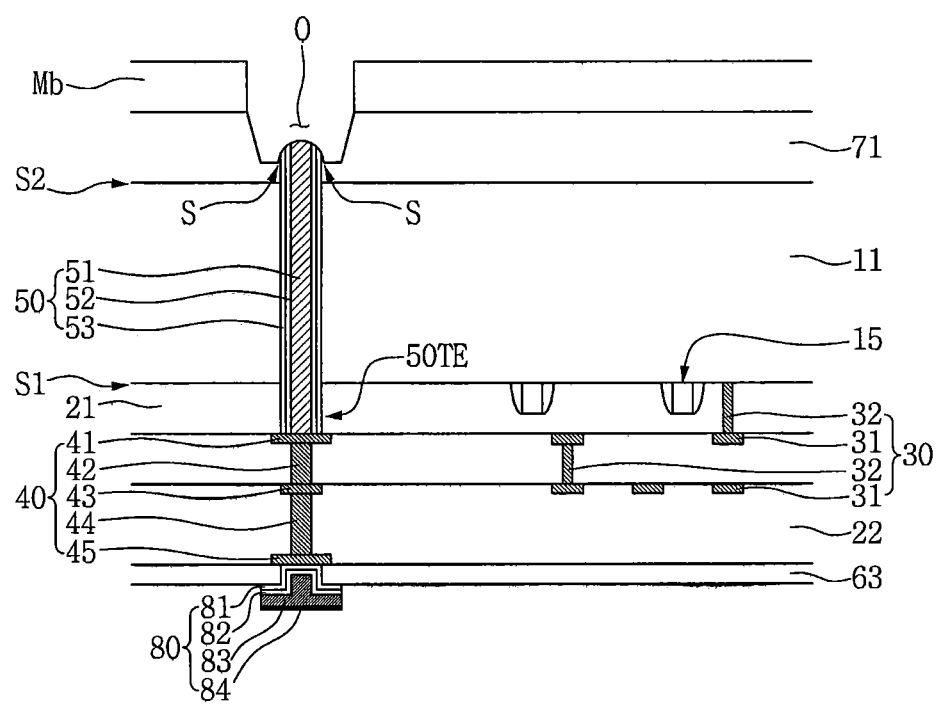
Figure 6C:
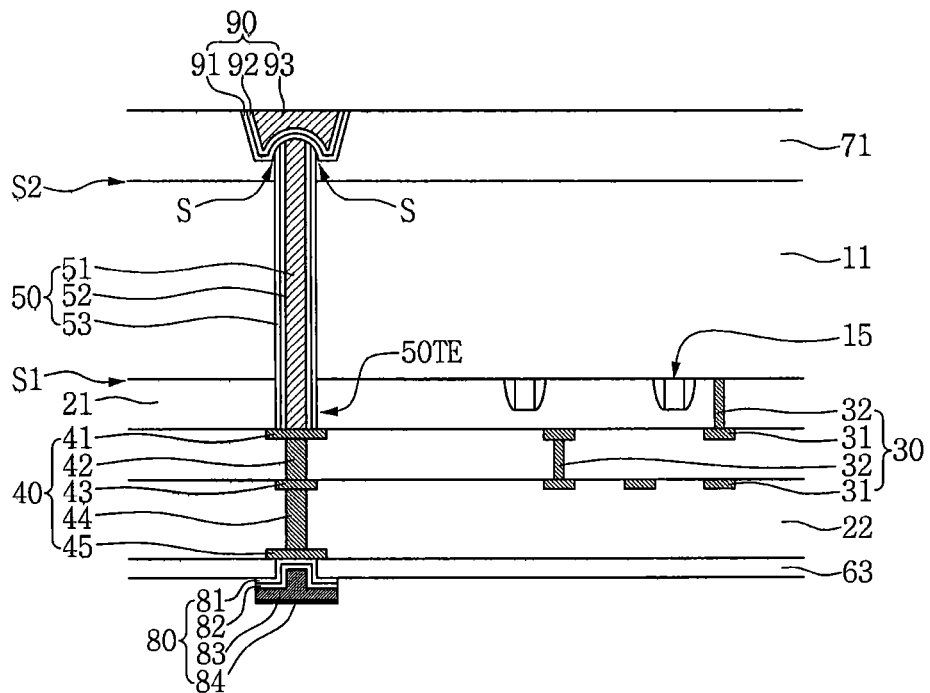

FIGS. 6A to 6C are cross-sectional views showing a method of fabricating a semiconductor device in accordance with an embodiment of the inventive concepts.

Referring to FIG. 6A, a method of fabricating a semiconductor device in accordance with an embodiment of the inventive concepts may include performing the processes described with reference to FIGS. 3A to 3H to form a back-side insulating layer 71 covering a bottom end 50BE of a TSV structure 50 which protrudes from a back-side S2 of a substrate 11. The back-side insulating layer 71 may have a thickness that is sufficient to cover the protruding bottom end 50BE of the TSV structure 50.

Referring to FIG. 6B, the method may include forming a back-side mask pattern Mb on the back-side insulating layer 71, and forming an opening O exposing the bottom end 50BE of the TSV structure 50 by performing an etching process using the back-side mask pattern Mb as an etch mask. Portions of the back-side insulating layer 71 may remain on side surfaces of the TSV liner of the bottom end 50BE of the TSV structure 50.

Referring to FIG. 6C, the method may include removing the back-side mask pattern Mb, and forming a back-side pad barrier layer 91, a back-side pad seed layer 92, and a back-side pad electrode 93 in the opening O to form a back-side bumping pad 90. Top surface of the back-side bumping pad 90 and the back-side insulating layer 71 may be coplanar. Portions of the back-side insulating layer 71 may remain as a spacer S between the bottom end 50BE of the TSV structure 50 and the back-side bumping pad 90.

Figure 7A:
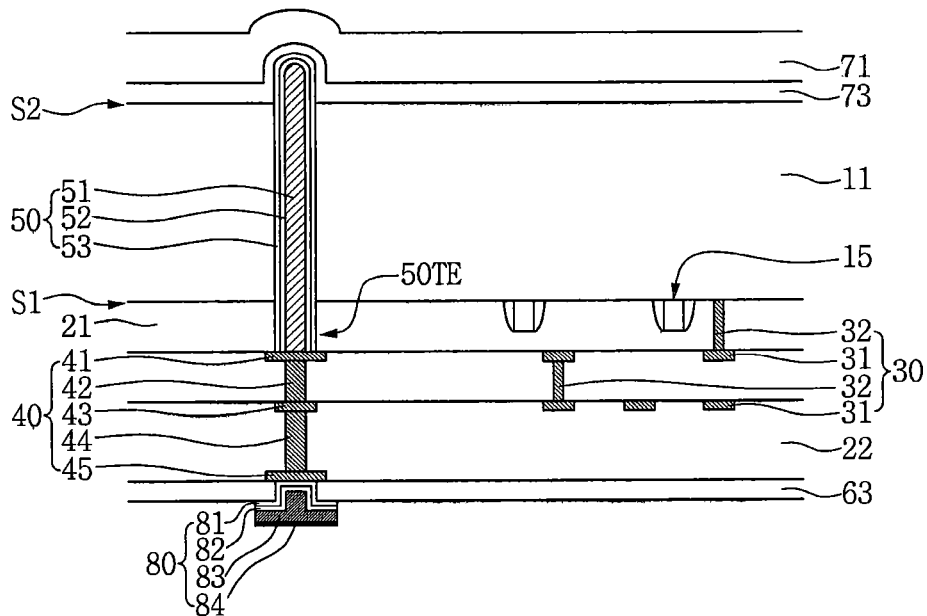
Figure 7B:
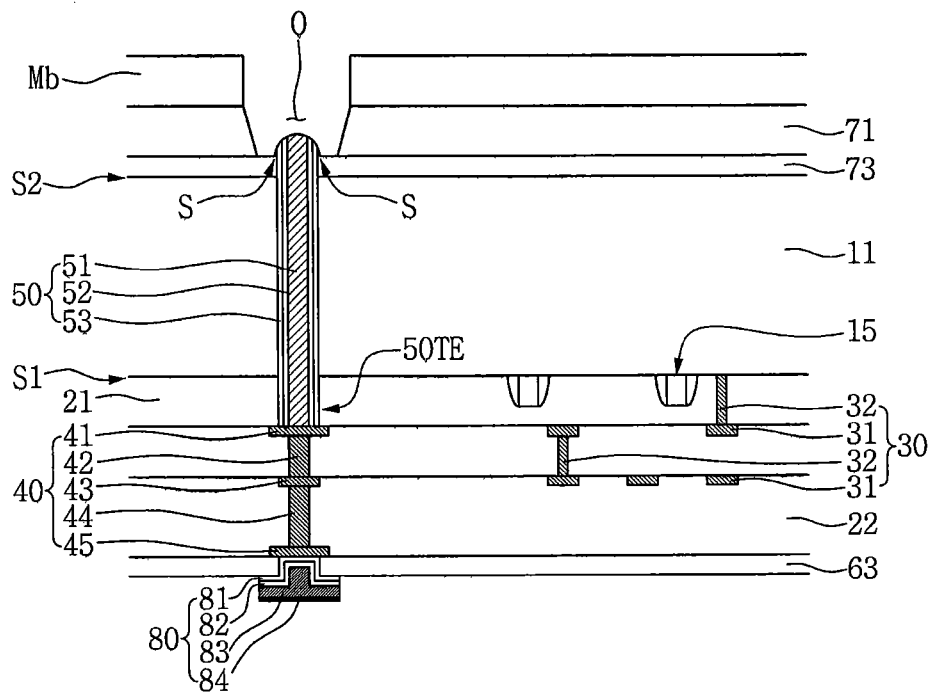
Figure 7C:
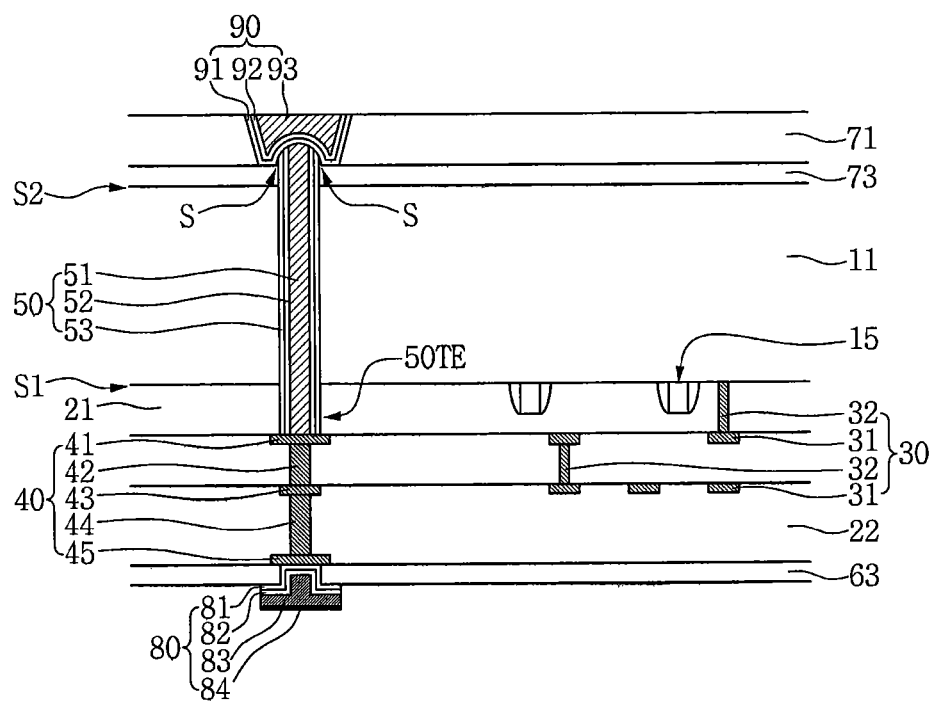

FIGS. 7A to 7C are cross-sectional views showing a method of fabricating a semiconductor device in accordance with an embodiment of the inventive concepts.

Referring to FIG. 7A, a method of fabricating a semiconductor device in accordance with an embodiment of the inventive concepts may include performing the processes described with reference to FIGS. 3A to 3H to form a back-side blocking layer 73 covering the bottom end 50BE of the TSV structure 50 protruding from the back-side S2 of the substrate 11, and forming a back-side insulating layer 71 on the back-side blocking layer 73.

Referring to FIG. 7B, the method may include forming a back-side mask pattern Mb on the back-side insulating layer 71, and forming an opening O exposing the bottom end 50BE of the TSV structure 50 by performing an etching process using the back-side mask pattern Mb as an etch mask. Portions of the back-side blocking layer 73 may remain as a spacer S on side surfaces of the TSV liner 51 of the bottom end 50BE of the TSV structure 50.

Referring to FIG. 7C, the method may include removing the back-side mask pattern Mb, and forming a back-side pad barrier layer 91, a back-side pad seed layer 92, and a back-side pad electrode 93 in the opening O to form a back-side bumping pad 90. Top surfaces of the back-side bumping pad 90 and the back-side insulating layer 71 may be coplanar. Portions of the back-side blocking layer 73 may remain as a spacer S between the bottom end 50BE of the TSV structure 50 and the back-side bumping pad 90.

Figure 8A:
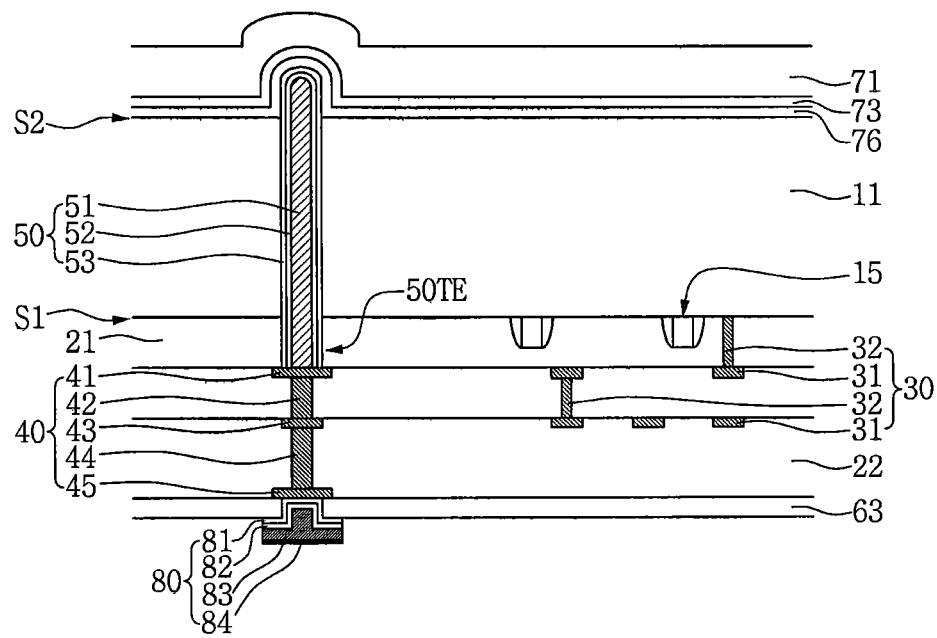
Figure 8B:
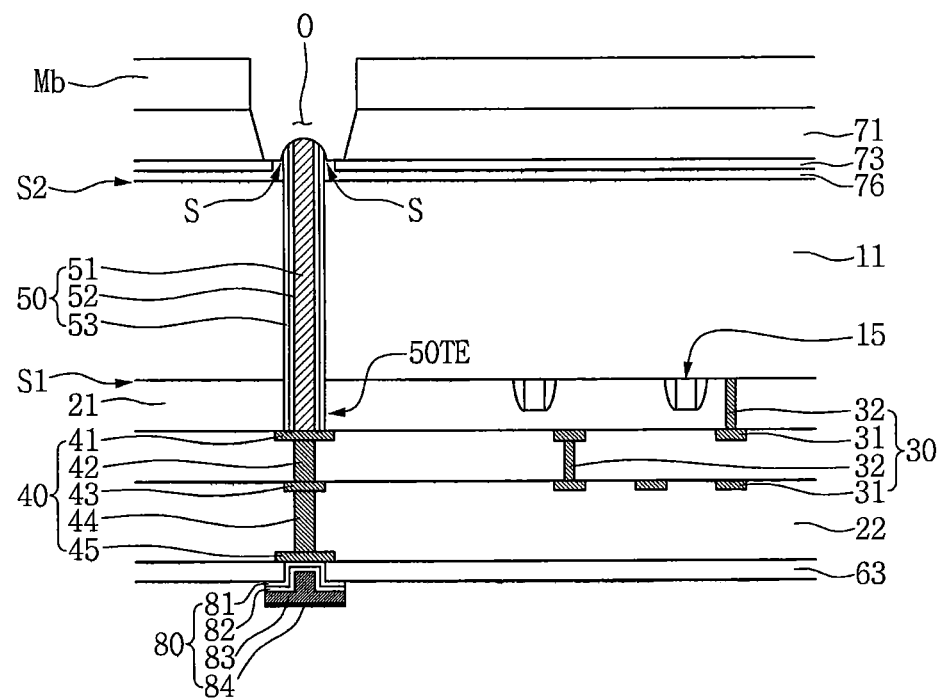
Figure 8C:
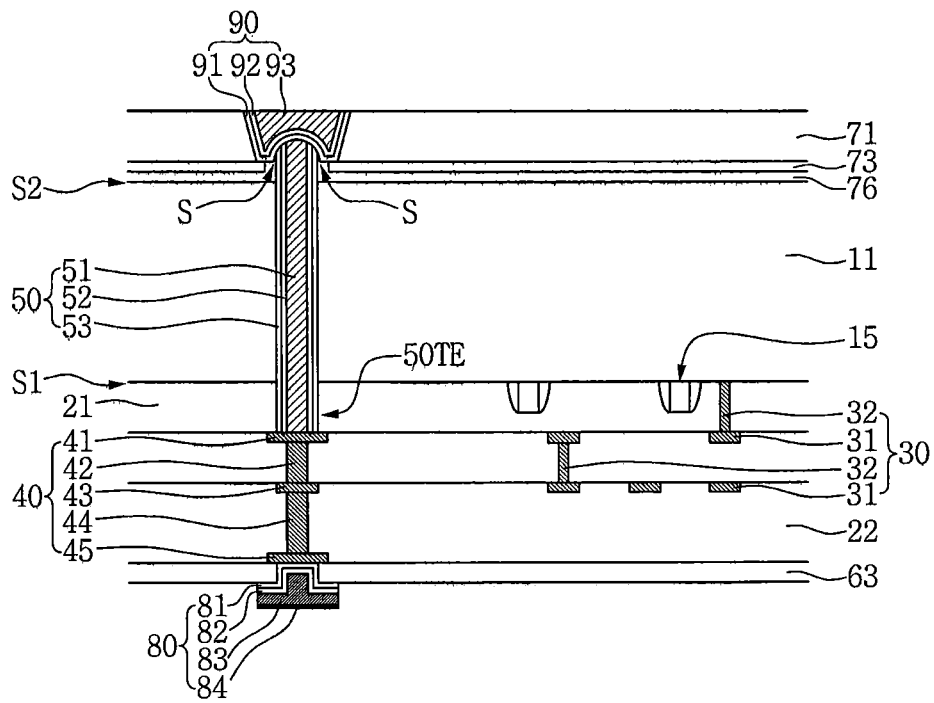

FIGS. 8A to 8C are cross-sectional views showing a method of fabricating a semiconductor device in accordance with an embodiment of the inventive concepts.

Referring to FIG. 8A, a method of fabricating a semiconductor device in accordance with an embodiment of the inventive concepts may include performing the processes described with reference to FIGS. 3A to 3H to form a back-side buffer layer 76 covering a bottom end 50BE of a TSV structure 50 protruding from a back-side S2 of a substrate 11, forming a back-side blocking layer 73 on the back-side buffer layer 76, and forming a back-side insulating layer 71 on the back-side blocking layer 73. The back-side buffer layer 76 may include silicon oxide ($SiO_2$).

Referring to FIG. 8B, the method may include forming a back-side pad mask pattern Mb on the back-side insulating layer 71, and forming an opening O exposing the bottom end 50BE of the TSV structure 50 by performing an etching process using the back-side mask pattern Mb as an etch mask. Portions of the back-side buffer layer 76 may remain as a spacer S on side surfaces of the TSV liner 51 of the bottom end 50BE of the TSV structure 50.

Referring to FIG. 8C, the method may include removing the back-side mask pattern Mb, and forming back-side pad barrier layer 91, a back-side pad seed layer 92, and a back-side pad electrode in the opening O to form a back-side bumping pad 90. Top surfaces of the back-side bumping pad 90 and the back-side insulating layer 71 may be coplanar. Portions of the back-side buffer layer 76 may remain as a spacer S between the bottom end 50BE of the TSV structure 50 and the back-side bumping pad 90.

Figure 9A:
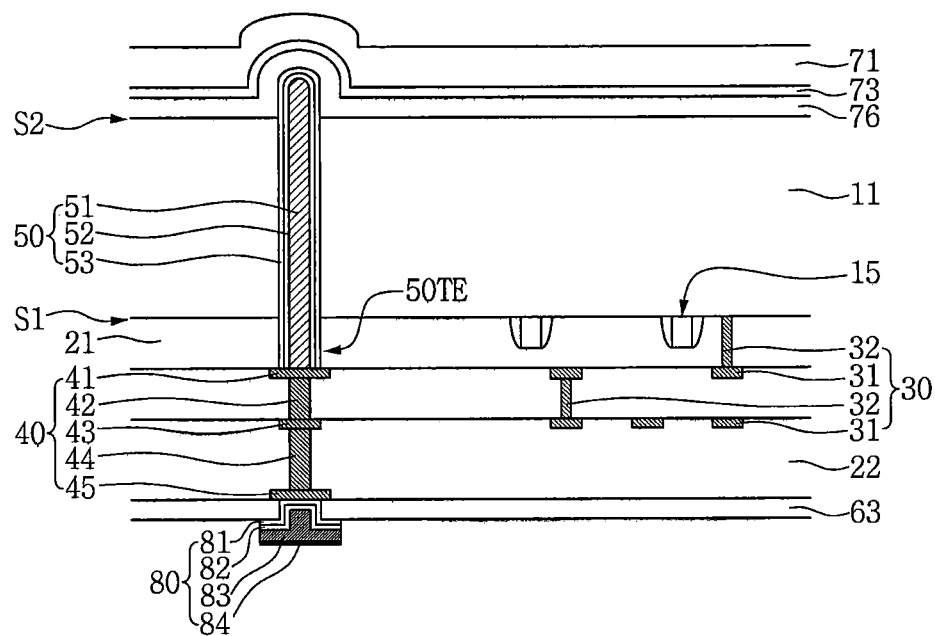
Figure 9B:
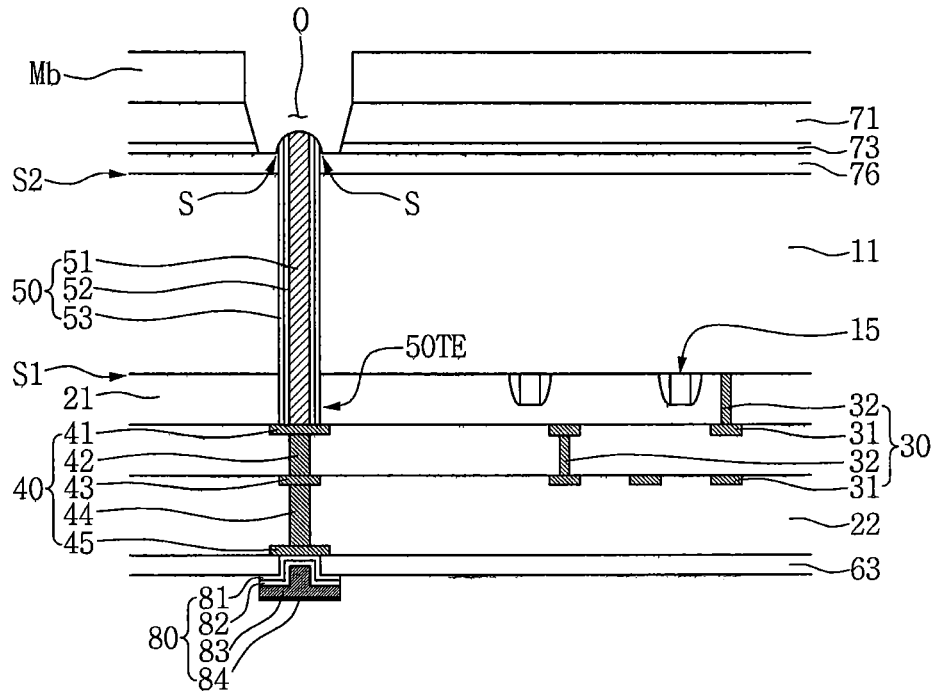
Figure 9C:
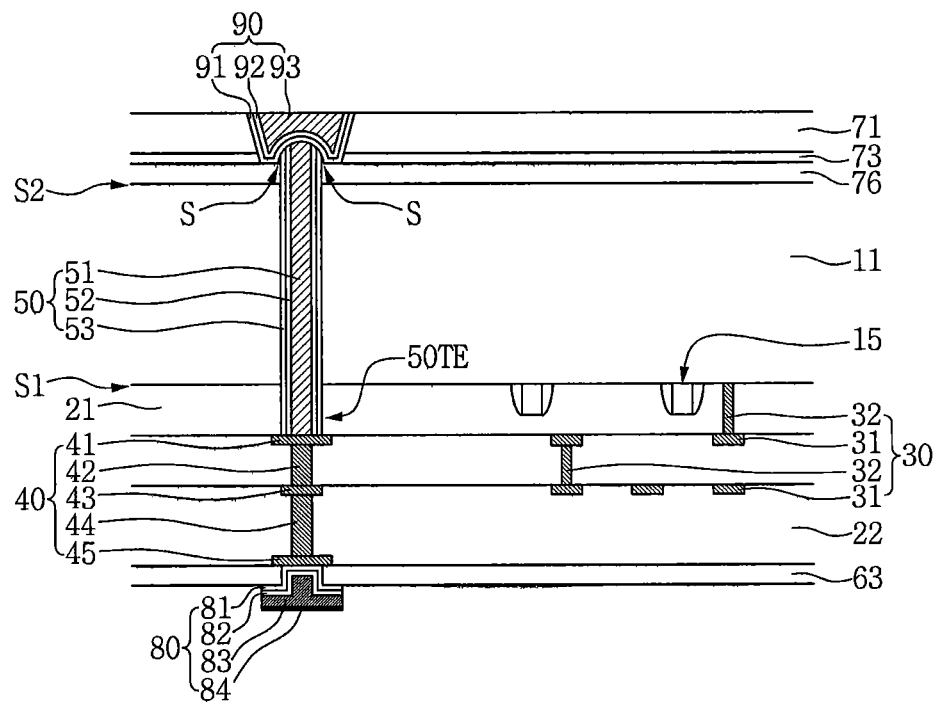

FIGS. 9A to 9C are cross-sectional views showing a method of fabricating a semiconductor device in accordance with an embodiment of the inventive concepts.

Referring to FIG. 9A, a method of fabricating a semiconductor device in accordance with an embodiment of the inventive concepts may include performing the processes described with reference to FIGS. 3A to 3H to form a back-side buffer layer 76 covering a bottom end 50BE of a TSV structure 50 protruding from a back-side S2 of a substrate 11, forming a back-side blocking layer on the back-side buffer layer 76, and forming a back-side insulating layer 71 on the back-side blocking layer 73.

Referring to FIG. 9B, the method may include forming a back-side pad mask Mb on the back-side insulating layer 71, and forming an opening O exposing the bottom end 50BE of the TSV structure 50 by performing an etching process using the back-side mask pattern Mb as an etch mask. Portions of the back-side buffer layer 76 may remain as a spacer S on side surfaces of the TSV liner 51 of the bottom end 50BE of the TSV structure 50.

Referring to FIG. 9C, the method may include removing the back-side mask pattern Mb, and forming a back-side pad barrier layer 91, a back-side pad seed layer 92, and a back-side pad electrode 93 in the opening O to form a back-side bumping pad 90. Top surfaces of the back-side bumping pad 90 and the back-side insulating layer 71 may be coplanar. Portions of the back-side buffer layer 76 may remain as a spacer S between the bottom end 50BE of the TSV structure 50 and the back-side bumping pad 90.

Figure 10A:
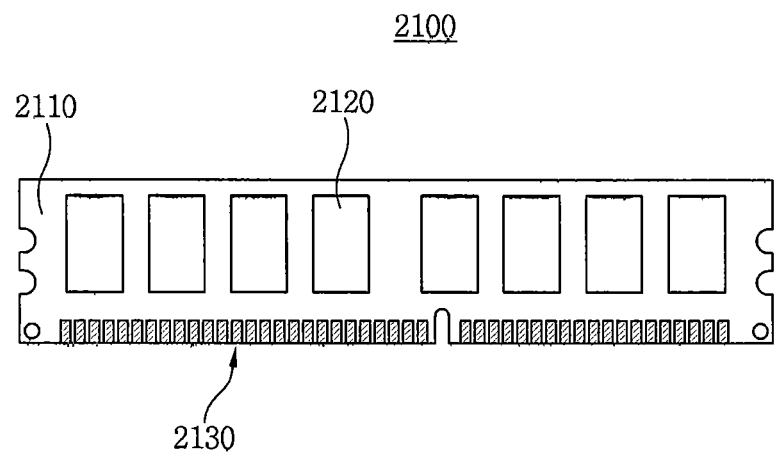
FIG. 10A schematically illustrates a memory module having at least one semiconductor devices in accordance with embodiments of the inventive concepts.

FIG. 10A is a diagram showing a memory module 2100 including at least one of the MRAM devices in accordance with various embodiments of the inventive concepts. Referring to FIG. 10A, the memory module 2100 in accordance with the embodiment of the inventive concepts may include a module substrate 2110, a plurality of memory devices 2120 disposed on the module substrate 2110, and a plurality of terminals 2130 arranged on a side of the module substrate 2110. The module substrate 2110 may include a printed circuit board (PCB). The memory devices 2120 may include at least one of the semiconductor devices 10A to 10H in accordance with various embodiments of the inventive concepts. The plurality of terminals 2130 may include a metal such as copper. Each of the terminals 2130 may be electrically connected with each of the memory devices 2120.

Figure 10B:
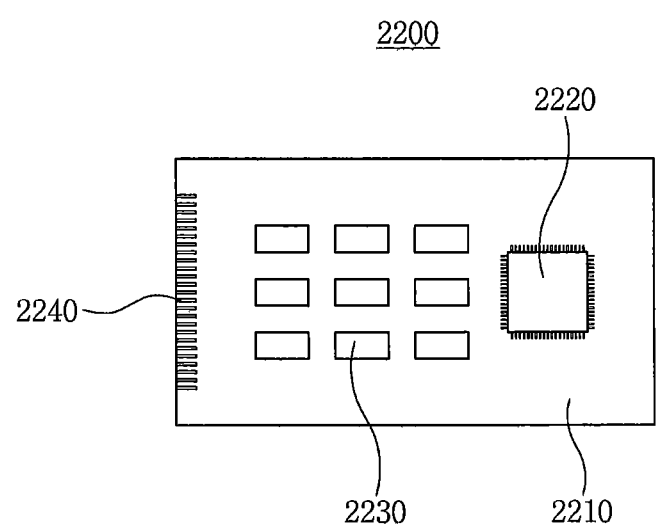
FIG. 10B schematically illustrates a semiconductor module having at least one semiconductor devices in accordance with the inventive concepts.

FIG. 10B is a diagram showing a semiconductor module 2200 in accordance with an embodiment of the inventive concepts. Referring to FIG. 10B, the semiconductor module 2200 in accordance with the embodiment of the inventive concepts may include a processor 2220 mounted on a module substrate 2210, and semiconductor devices 2230. The processor 2220 or the semiconductor devices 2230 may include at least one of the semiconductor devices 10A to 10I1 in accordance with various embodiments of the inventive concepts. Conductive input/output terminals 2240 may be disposed on at least one side of the module substrate 2210.

Figure 10C:
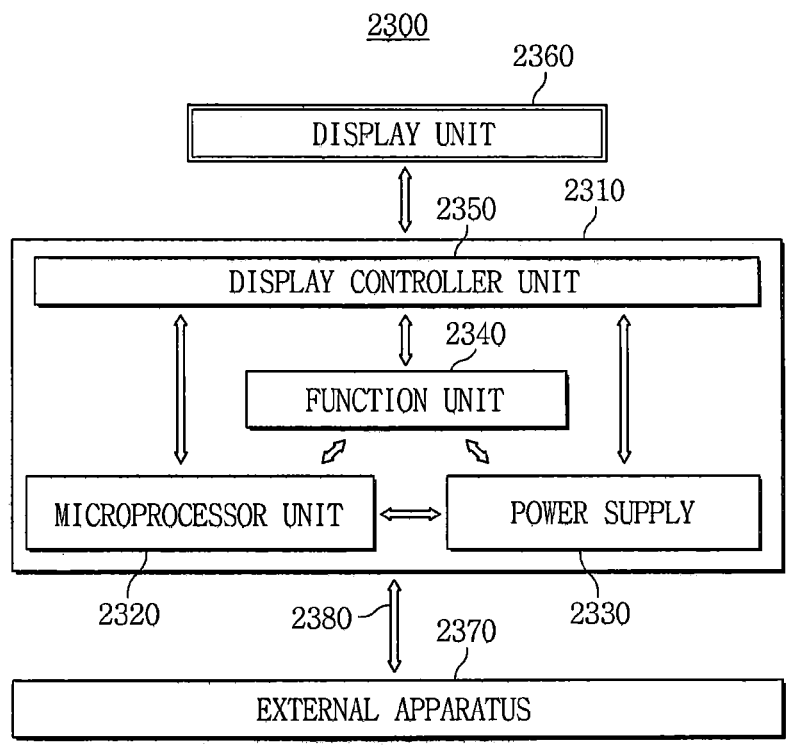
FIGS. 10C and 10D are conceptual block diagrams showing electronic systems having semiconductors in accordance with embodiments on the inventive concepts.
Figure 10D:
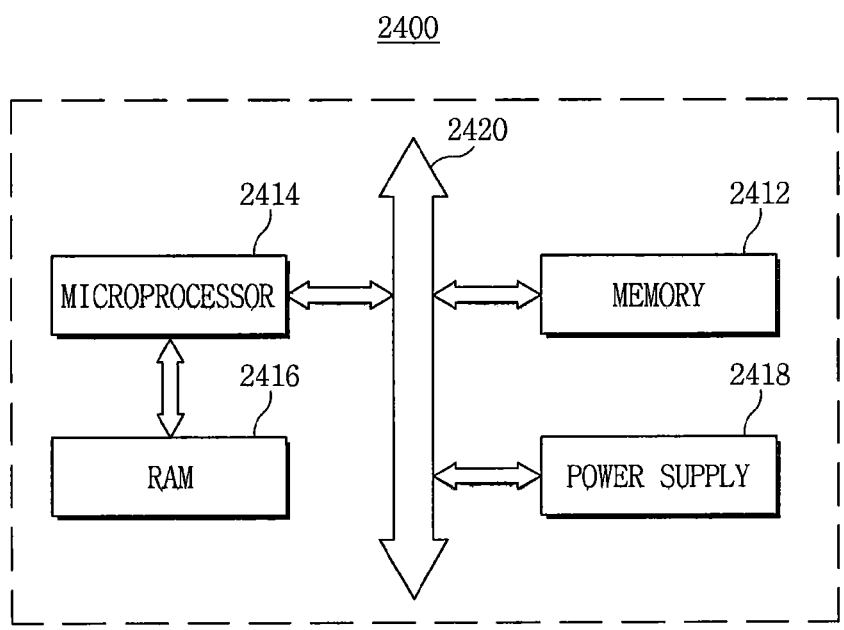

FIGS. 10C and 10D are block diagrams showing electronic systems 2300 and 2400 in accordance with embodiments of the inventive concepts. Referring to FIG. 10C, the electronic system 2300 in accordance with the embodiment of the inventive concepts may include a body 2310, a display unit 2360, and an external apparatus 2370. The body 2310 may include a microprocessor unit 2320, a power supply 2330, a function unit 2340, and/or a display controller unit 2350. The body 2310 may include a system board or motherboard including a PCB and/or a case. The microprocessor unit 2320, the power supply 2330, the function unit 2340, and the display controller unit 2350 may be mounted or disposed on a top surface or an inside of the body 2310. The display unit 2360 may be disposed on the top surface of the body 2310 or an inside/outside of the body 2310. The display unit 2360 may display an image processes by the display controller unit 2350. For example, the display unit 2360 may include a liquid crystal display (LCD), an active matrix organic light emitting diode (AMOLED), or various display panels. The display unit 2360 may include a touch screen. Accordingly, the display unit 2360 may include an input/output function. The power supply 2330 may supply a current or voltage to the microprocessor unit 2320, the function unit 2340, the display controller unit 2350, etc. The power supply 2330 may include a rechargeable battery, a socket for the battery, or a voltage/current converter. The microprocessor unit 2320 may receive a voltage from the power supply 2330 to control the function unit 2340 and the display unit 2360. For example, the microprocessor unit 2320 may include a CPU or an application processor (AP). The function unit 2340 may include a touch-screen, a volatile/nonvolatile memory, a memory card controller, a camera, a light, an audio and video playback processor, a wireless transmission/reception antenna, a speaker, a microphone, a USB port, and other units having various functions. The microprocessor unit 2320 or the function unit 2340 may include at least one of the semiconductor devices 10A to 10H in accordance with various embodiments of the inventive concepts.

Referring to FIG. 10D, an electronic system 2400 in accordance with an embodiment of the inventive concepts may include a microprocessor 2414, a memory 2412, and a user interface 2418 which performs data communication using a bus 2420. The microprocessor 2414 may include a CPU or an AP. The electronic system 2400 may further include a random access memory (RAM) 2416 which directly communicates with the microprocessor 2414. The microprocessor 2414 and/or the RAM 2416 may be assembled in a single package. The user interface 2418 may be used to input data to or output data from the electronic system 2400. For example, the user interface 2418 may include a touch-pad, a touch-screen, a keyboard, a mouse, a scanner, a voice detector, a cathode ray tube (CRT) monitor, an LCD, an AMOLED, a plasma display panel (PDP), a printer, a light, or various other input/output devices. The memory 2412 may store codes for operating the microprocessor 2414, data processes by the microprocessor 2414, or external input data. The memory 2412 may include a memory controller, a hard disk, or a solid state drive (SSD). The microprocessor 2414, the RAM 2416, and/or the memory 2412 may include at least one of the semiconductor devices 10A-10H in accordance with various embodiments of the inventive concepts.

The semiconductor devices in accordance with embodiments of the inventive concepts may include fine pitch bumping pads formed by a damascene process. Accordingly, a degree of the semiconductors and a size of the semiconductor devices are improved.

The bumping pads of the semiconductor devices in accordance embodiments of the inventive concepts may not protrude and may not be exposed. Accordingly, the semiconductor devices have excellent physical/electrical endurance and reliability.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims.

What is claimed is:

1. A semiconductor device comprising:
   a substrate;
   a first interlayer insulating layer disposed on a front-side of the substrate;
   a through silicon via (TSV) structure passing through the first interlayer insulating layer and the substrate, wherein the TSV structure has a bottom end protruding from a back-side of the substrate;
   a back-side insulating layer and a back-side passivation layer disposed on the back-side of the substrate;
   a back-side bumping pad buried in the back-side insulating layer and the back-side passivation layer and disposed on the bottom end of the TSV structure;
   a TSV connection circuit disposed on the first interlayer insulating layer;
   a second interlayer insulating layer on the TSV connection circuit; and
   a front-side bumping pad disposed on the second interlayer insulating layer,
   wherein the bottom end of the TSV structure protrudes into the back-side bumping pad,
   wherein the back-side passivation layer is a most external layer,
   wherein top surfaces of the back-side passivation layer and the back-side bumping pad are coplanar, and
   wherein the TSV connection circuit comprises:
      a TSV connection pad disposed on the first interlayer insulating layer to be in contact with the TSV structure; and
      a TSV connection via disposed on the TSV connection pad,
      wherein the TSV connection via protrudes from a surface of the second interlayer insulating layer into the front-side bumping pad.

2. The semiconductor device of claim 1, wherein the TSV structure comprises:
   a TSV plug;
   a TSV barrier layer surrounding side surfaces of the TSV plug; and
   a TSV liner surrounding side surfaces of the TSV barrier layer,
   wherein the TSV plug has a top end and a bottom end which are not surrounded by the TSV barrier layer and the TSV liner and exposed by the TSV barrier layer and the TSV liner.

3. The semiconductor device of claim 2, wherein the back-side bumping pad comprises:
   a back-side pad electrode;
   a back-side pad seed layer surrounding a bottom surface and side surfaces of the back-side pad electrode; and
   a back-side pad barrier layer surrounding a bottom surface and side surfaces of the back-side pad seed layer,
   wherein the back-side pad barrier layer is in contact with the TSV plug.

4. The semiconductor device of claim 3, wherein the back-side insulating layer has portions which remain as a spacer between the back-side bumping pad and the TSV structure.

5. The semiconductor device of claim 1, wherein the front-side bumping pad comprises:
a front-side pad electrode;
a front-side pad seed layer surrounding a bottom surface and side surfaces of the front-side pad electrode; and
a front-side pad barrier layer surrounding a bottom surface and side surfaces of the front-side pad seed layer,
wherein the front-side pad barrier layer is in contact with the TSV connection via.

6. The semiconductor device of claim 1, further comprising:
a MOS transistor disposed on the front-side of the substrate; and
an inner wire and an inner via disposed on the first interlayer insulating layer,
wherein the inner via is electrically connected with the substrate or the MOS transistor.

7. The semiconductor device of claim 1, wherein the back-side insulating layer comprises silicon oxide and the back-side passivation layer comprises silicon nitride.

8. The semiconductor device of claim 7, wherein the back-side insulating layer is in contact with side surfaces of the TSV structure, and the back-side passivation layer is not in contact with the side surfaces of the TSV structure.

9. The semiconductor device of claim 1, further comprising:
a back-side blocking layer disposed between the back-side insulating layer and the back-side passivation layer and be in contact with side surfaces of the back-side bumping pad,
wherein the back-side blocking layer comprises silicon carbonitride.

10. The semiconductor device of claim 9, further comprising:
a back-side stopper layer disposed between the back-side insulating layer and the back-side blocking layer to be in contact with the side surfaces of the back-side bumping pad,
wherein the back-side stopper layer comprises silicon nitride.

11. A semiconductor device comprising:
a substrate;
a MOS transistor disposed on a front-side of the substrate;
a first interlayer insulating layer on the MOS transistor;
a through silicon via (TSV) structure passing through the first interlayer insulating layer and the substrate;
a second interlayer insulating layer on the TSV structure;
a TSV connection circuit disposed on the first interlayer insulating layer and in the second interlayer insulating layer to be electrically connected with a top end of the TSV structure;
a front-side bumping pad disposed on the front-side of the substrate to be electrically connected with the TSV connection circuit; and
a back-side bumping pad disposed on a back-side of the substrate and connected with the TSV structure,
wherein a bottom end of the TSV structure protrudes into the back-side bumping pad, and
wherein the TSV connection circuit comprises an upper TSV connection via comprising a top end that protrudes from a surface of the second interlayer insulating layer and protrudes into the front-side bumping pad.

12. The semiconductor device of claim 11, wherein the TSV connection circuit further comprises:
a TSV pad disposed on the first interlayer insulating layer to be in contact with the top end of the TSV structure;
a lower TSV connection via on the TSV pad; and
a TSV connection wire on the lower TSV connection via, wherein the upper TSV connection via is on the TSV connection wire.

13. The semiconductor device of claim 12, wherein the upper TSV connection via comprises:
a TSV connection via plug; and
a TSV via barrier layer surrounding a bottom surface and side surfaces of the TSV connection via plug and being in contact with the TSV connection wire,
wherein the TSV connection via plug has a top end which protrudes into the front-side bumping pad.

14. The semiconductor device of claim 11, further comprising:
an inner circuit disposed on the first interlayer insulating layer and in the second interlayer insulating layer; and
a front-side insulating layer and a front-side passivation layer disposed on the second interlayer insulating layer,
wherein the front-side insulating layer and the front-side passivation layer surround side surfaces of the front-side bumping pad.

15. A semiconductor device comprising:
a substrate;
a first interlayer insulating layer disposed on a front-side of the substrate;
a through silicon via (TSV) structure passing through the first interlayer insulating layer and the substrate;
a TSV connection circuit disposed on the first interlayer insulating layer to be electrically connected with a top end of the TSV structure;
a second interlayer insulating layer disposed on the first interlayer insulating layer and the TSV connection circuit;
a front-side bumping pad disposed on the second interlayer insulating layer to be electrically connected with the TSV connection circuit;
a back-side bumping pad disposed on a back-side of the substrate and connected with a bottom end of the TSV structure; and
a back-side blocking layer disposed on the back-side of the substrate and in contact with side surfaces of the back-side bumping pad,
wherein the bottom end of the TSV structure protrudes into the back-side bumping pad, and the back-side blocking layer comprises silicon carbonitride.

16. The semiconductor device of claim 15, wherein the TSV connection circuit comprises:
a TSV pad disposed on the first interlayer insulating layer to be in contact with the top end of the TSV structure; and
a TSV connection via in contact with the front-side bumping pad,
wherein the TSV connection via protrudes into the front-side bumping pad.

17. The semiconductor device of claim 16, wherein the TSV connection via comprises a TSV connection via plug and a TSV connection via barrier layer surrounding a bottom surface and side surfaces of the TSV connection via plug, and a top surface and side surfaces of a top end of the TSV connection via plug are not covered by the TSV connection via barrier layer.

18. The semiconductor device of claim 15, wherein the TSV structure comprises:
a TSV plug;
a TSV barrier layer surrounding side surfaces of the TSV plug; and
a TSV liner surrounding the TSV barrier layer, wherein the TSV plug has a bottom end in which portions of a bottom surface and side surfaces thereof are not surrounded by the TSV barrier layer and the TSV liner and exposed by the TSV barrier layer and the TSV liner.

19. The semiconductor device of claim 15, wherein the back-side bumping pad comprises:

a back-side pad electrode; and a back-side pad barrier layer surrounding a bottom surface and side surfaces of the back-side pad electrode, wherein the back-side pad barrier layer is conformally formed on a top surface and side surfaces of the bottom end of the TSV structure.

\* \* \* \* \*